(12) United States Patent
Matsubara et al.

(10) Patent No.: US 10,809,097 B2
(45) Date of Patent: Oct. 20, 2020

(54) DETECTOR APPARATUS AND DETECTOR SYSTEM

(71) Applicant: Asahi Kasei Microdevices Corporation, Tokyo (JP)

(72) Inventors: Masao Matsubara, Tokyo (JP); Kazuhiro Nishimura, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 141 days.

(21) Appl. No.: 16/141,951

(22) Filed: Sep. 25, 2018

(65) Prior Publication Data
US 2019/0101414 A1 Apr. 4, 2019

(30) Foreign Application Priority Data

Sep. 29, 2017 (JP) .................................. 2017-190983
Aug. 29, 2018 (JP) .................................. 2018-160020

(51) Int. Cl.
*G01R 31/00* (2006.01)
*G01D 5/16* (2006.01)
*H01L 43/08* (2006.01)
*G01D 5/244* (2006.01)
*G01D 5/14* (2006.01)

(52) U.S. Cl.
CPC .............. *G01D 5/16* (2013.01); *G01D 5/147* (2013.01); *G01D 5/24438* (2013.01); *H01L 43/08* (2013.01)

(58) Field of Classification Search
USPC .......................... 324/207.21, 167, 386, 631
See application file for complete search history.

(56) References Cited

U.S. PATENT DOCUMENTS

| 2008/0012558 A1* | 1/2008 | Rossler | .................. | B82Y 25/00 |
| | | | | 324/252 |
| 2013/0278250 A1 | 10/2013 | Raberg | | |
| 2014/0118048 A1 | 5/2014 | Miyazaki | | |
| 2016/0123774 A1* | 5/2016 | Foletto | .................. | G01D 5/2046 |
| | | | | 324/207.21 |

(Continued)

FOREIGN PATENT DOCUMENTS

| JP | S61711 A | 1/1986 |
| JP | S6266116 A | 3/1987 |
| JP | H0540819 A | 2/1993 |

(Continued)

*Primary Examiner* — Vincent Q Nguyen

(57) ABSTRACT

In a detector apparatus, a first magnetosensitive unit includes first and third magnetic resistor elements arranged next to each other in a moving direction of the to-be-detected unit and electrically connected in series between a first potential and a second potential, a second magnetosensitive unit includes second and fourth magnetic resistor elements arranged next to each other in the moving direction of the to-be-detected unit and electrically connected in series between the first potential and the second potential, and as for resistances for a same magnetic field, a relation of whether or not a resistance of the third magnetic resistor element is higher than a resistance of the first magnetic resistor element is the same as a relation of whether or not a resistance of the second magnetic resistor element is higher than a resistance of the fourth magnetic resistor element.

22 Claims, 16 Drawing Sheets

(56) References Cited

U.S. PATENT DOCUMENTS

2017/0356761 A1\* 12/2017 Vig .................. G01D 5/142

FOREIGN PATENT DOCUMENTS

| JP | H07190804 A | 7/1995 |
| JP | 2000180207 A | 6/2000 |
| JP | 2003329752 A | 11/2003 |
| JP | 2007127456 A | 5/2007 |
| JP | 2007192722 A | 8/2007 |
| JP | 4240306 B2 | 3/2009 |
| JP | 4308084 B2 | 8/2009 |

\* cited by examiner

DETECTOR APPARATUS AND DETECTOR SYSTEM

The contents of the following Japanese patent applications are incorporated herein by reference:
NO. 2017-190983 filed in JP on Sep. 29, 2017 and
NO. 2018-160020 filed in JP on Aug. 29, 2018.

BACKGROUND

1. Technical Field

The present invention relates to a detector apparatus and a detector system.

2. Related Art

In the conventional art, a known detector apparatus is configured to detect rotation of a rotator, for example, the rotational speed, by using a magnetic resistor element having a magnetosensitive region that is formed by a compound semiconductor thin film (see, for example, Patent Documents 1 and 2).

Patent Document 1: Japanese Patent No. 4240306
Patent Document 2: Japanese Patent No. 4308084

Such a detector apparatus includes a magnetic-field generating unit such as a magnet and a plurality of magnetic resistor elements positioned relative to the rotator and can detect the rotation of the rotator by detecting a variation in the magnetic flux density that is caused by the relative movement of the rotator. When the rotator and detector apparatus are reduced in size, however, the detected rotation may possibly contain errors since different magnetic fields are applied to the plurality of magnetic resistor elements since the respective magnetic resistor elements are positioned at different distances from the rotator.

SUMMARY

A first aspect of the present invention provides a detector apparatus comprising a first magnetosensitive unit and a second magnetosensitive unit configured to detect a change in magnetic flux density that is caused by relative movement of a to-be-detected unit, the first magnetosensitive unit includes a first magnetic resistor element and a third magnetic resistor element that are arranged next to each other in a moving direction of the to-be-detected unit and that are electrically connected in series between a first potential and a second potential, the second magnetosensitive unit includes a second magnetic resistor element and a fourth magnetic resistor element that are arranged next to each other in the moving direction of the to-be-detected unit and that are electrically connected in series between the first potential and the second potential, the second magnetic resistor element is positioned between the first magnetic resistor element and the third magnetic resistor element in the moving direction, the third magnetic resistor element is positioned between the second magnetic resistor element and the fourth magnetic resistor element in the moving direction, and as for resistances for a same magnetic field, a relation of whether or not a resistance of the third magnetic resistor element is higher than a resistance of the first magnetic resistor element is the same as a relation of whether or not a resistance of the second magnetic resistor element is higher than a resistance of the fourth magnetic resistor element.

A second aspect of the present invention provides a detector system including a to-be-detected unit and the detector apparatus relating to the first aspect that faces the to-be-detected unit.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
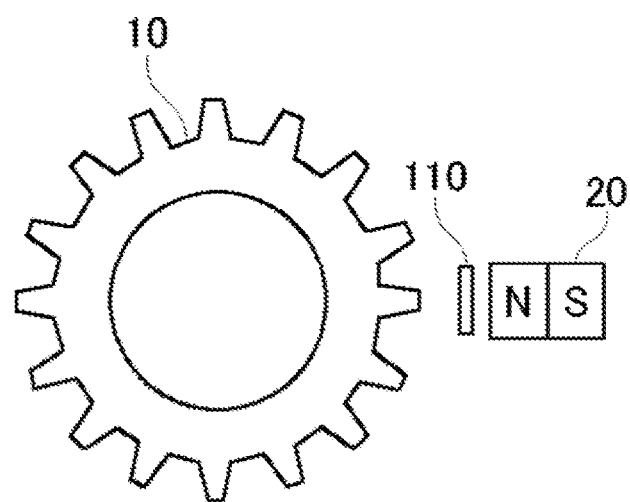
FIG. 1 shows an exemplary configuration of a detector system 100 configured to detect movement of a to-be-detected unit in accordance with an embodiment of the present invention.

FIG. 1 shows an exemplary configuration of a detector system 100 configured to detect movement of a to-be-detected unit in accordance with an embodiment of the present invention. In the present embodiment, the description is made with reference to an exemplary case where the to-be-detected unit is a rotator 10. In this case, the detector system 100 is configured to detect the rotation of the rotator 10, specifically speaking, the rotational angle, rotational speed, rotational direction and number of rotations of the rotator 10. The detector system 100 is structured such that a detector apparatus 110 including magnetic resistor elements is positioned between the rotator 10 and a magnet and configured to detect the rotation of the rotator 10 with reference to variation in the resistances of the magnetic resistor elements. In the present embodiment, the magnetic resistor elements are shown as an example of magnetic sensors. The detector system 100 includes the rotator 10, a magnetic-field generating unit 20 and the detector apparatus 110.

The rotator 10 has protrusions and/or depressions and is configured to rotate around the rotation axis. For example, the cross-section of the rotator 10 that is substantially orthogonal to the rotation axis has a circular shape. Here, this cross-section of the rotator 10 may partially have a circular shape. The rotator 10 may have protrusions and depressions that are alternately arranged along the relative moving direction so as to face the detector apparatus 110. The rotator 10 is, for example, a gear. FIG. 1 shows an exemplary case where the rotator 10 is shaped like a disk and the protrusions and depressions are alternately arranged on the circumference of the disk along the moving direction of the rotation.

The magnetic-field generating unit 20 is configured to generate a substantially constant predetermined magnetic field. For example, the magnetic-field generating unit 20 includes a magnet and positioned in such a manner that the north or south pole is directed toward the rotator 10. The magnetic-field generating unit 20 opposes the rotator 10 with the detector apparatus 110 sandwiched therebetween. The magnetic-field generating unit 20 is positioned near the rotator 10 to such an extent that the generated magnetic field can reach the protrusions and/or depressions of the rotator 10. The magnetic-field generating unit 20 is, for example, a permanent magnet made of ferrite, samarium cobalt, neodymium and the like.

The detector apparatus 110 faces the rotator 10. The detector apparatus 110 is positioned between the rotator 10 and the magnetic-field generating unit 20 and faces the protrusions and/or depressions of the rotator 10. The detector apparatus 110 detects the magnetic flux density that is generated by the magnetic-field generating unit 20 and varied by the protrusions and/or the depressions of the rotator 10. The detector apparatus 110 detects the rotation of the rotator 10 based on the variation in the magnetic flux density that is caused by the rotation of the rotator 10. The above-described detector system 100 is described in detail in the following.

Figure 2:
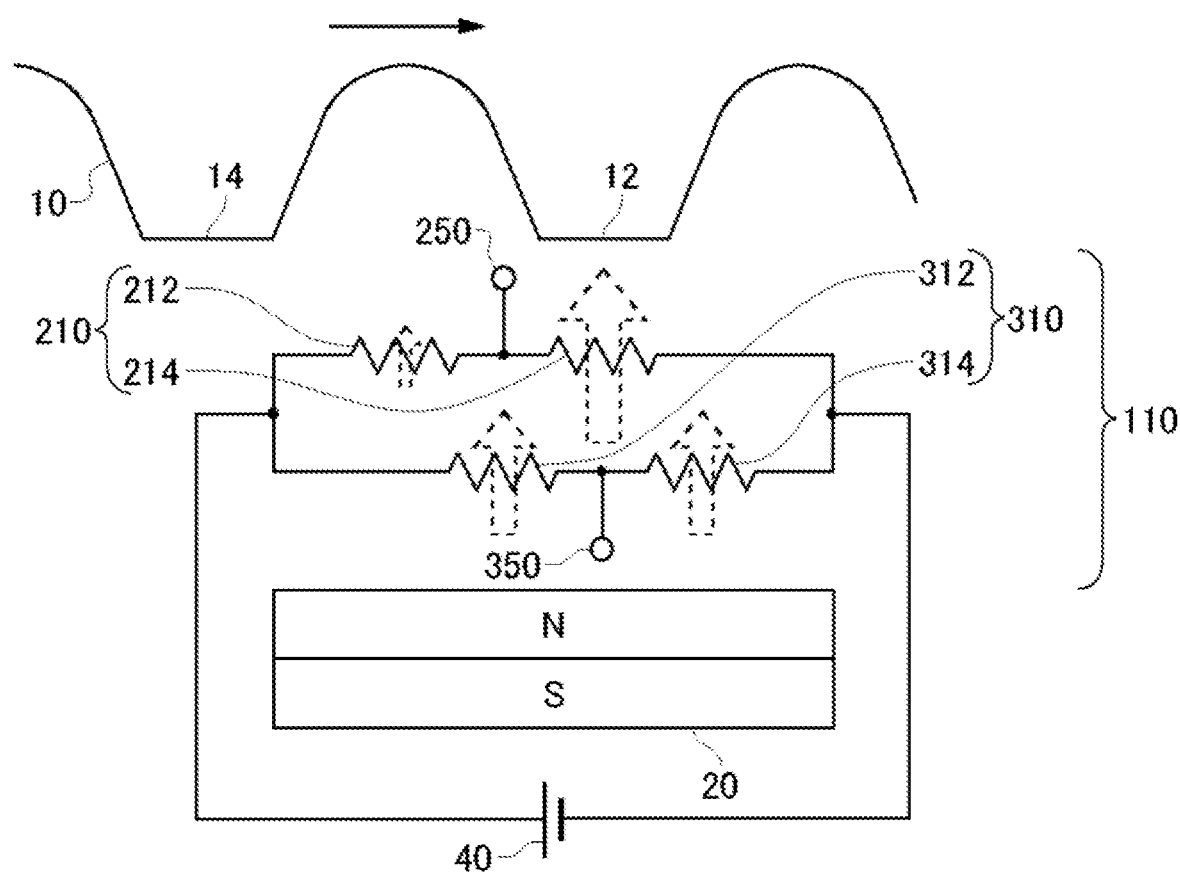
FIG. 2 shows the exemplary configuration of the detector system 100 in accordance with the embodiment of the present invention in more details.

FIG. 2 shows the exemplary configuration of the detector system 100 in accordance with the embodiment of the present invention in more details. Referring to the detector system 100 shown in FIG. 2, the constituents that operate in substantially the same manner as the corresponding constituents of the detector system 100 shown in FIG. 1 are assigned with the identical reference numerals and not described here. In FIG. 2, the arrow indicates, as an example, the moving direction of the rotator 10. FIG. 2 shows an exemplary case where the detector system 100 further includes a power source 40.

The power source 40 has one terminal of a first potential and the other terminal of a second potential, and is configured to feed, to the detector apparatus 110, power source voltage corresponding to the potential difference between the first potential and the second potential. FIG. 2 shows an exemplary case where the first potential is higher than the second potential. The second potential may be the ground potential.

FIG. 2 shows a first tooth 12 and a second tooth 14, which constitute part of the gear of the rotator 10. FIG. 2 shows an exemplary case where the detector apparatus 110 includes a first magnetosensitive unit 210, a first terminal 250, a second magnetosensitive unit 310 and a second terminal 350.

The first magnetosensitive unit 210 and the second magnetosensitive unit 310 are configured to detect variation in the magnetic flux density that is caused by the relative movement of the rotator 10. FIGS. 1 and 2 shows an exemplary case where, in the detector system 100, the magnetic-field generating unit 20 and the detector apparatus 110 are stationary and the rotator 10 rotates. In other words, the relative movement of the rotator 10 is realized by the movement of the rotator 10 in the circumferential direction. The first magnetosensitive unit 210 and the second magnetosensitive unit 310 may detect the rotational angle, rotational speed and number of rotations of the rotator 10. The first magnetosensitive unit 210 and the second magnetosensitive unit 310 may be used to detect the rotational direction of the rotator 10.

The first terminal 250 and the second terminal 350 output the detected result. The first magnetosensitive unit 210 and the second magnetosensitive unit 310 receive the power source voltage from the power source 40. The first magnetosensitive unit 210 includes a first magnetic resistor element 212 and a third magnetic resistor element 214. The first magnetic resistor element 212 is connected between the first terminal 250 and the first potential of the power source 40. The third magnetic resistor element 214 is connected between the first terminal 250 and the second potential of the power source 40.

The first magnetic resistor element 212 and the third magnetic resistor element 214 are arranged next to each other in the moving direction of the rotator 10 and connected to the power source 40. In other words, the first magnetic resistor element 212 and the third magnetic resistor element 214 are electrically connected in series between the first potential and the second potential. In this case, the first terminal 250 outputs the voltage obtained by dividing the power source voltage by the first magnetic resistor element 212 and the third magnetic resistor element 214.

The second magnetosensitive unit 310 includes a second magnetic resistor element 312 and a fourth magnetic resistor element 314. The second magnetic resistor element 312 is connected between the second terminal 350 and the first potential of the power source 40. The fourth magnetic resistor element 314 is connected between the second terminal 350 and the second potential of the power source 40.

The second magnetic resistor element 312 and the fourth magnetic resistor element 314 are arranged next to each other in the moving direction of the rotator 10 and connected to the power source 40. In other words, the second magnetic resistor element 312 and the fourth magnetic resistor element 314 are electrically connected in series between the first potential and the second potential. In this case, the second terminal 350 outputs the voltage obtained by dividing the power source voltage by the second magnetic resistor element 312 and the fourth magnetic resistor element 314.

The second magnetic resistor element 312 is positioned between the first magnetic resistor element 212 and the third magnetic resistor element 214 in the moving direction of the rotator 10. The third magnetic resistor element 214 is positioned between the second magnetic resistor element 312 and the fourth magnetic resistor element 314 in the moving direction of the rotator 10.

The resistances of the magnetic resistor elements such as the first magnetic resistor element 212, the second magnetic resistor element 312, the third magnetic resistor element 214 and the fourth magnetic resistor element 314, vary in accordance with variation in the magnetic flux density applied by the magnetic-field generating unit 20, where the variation is caused by the relative movement of the rotator 10. For example, the resistance of the magnetic resistor element increases as the magnetic flux density of the magnetic field applied to the magnetic resistor element increases. The magnetic resistor element may include a semiconductor magnetic resistor element in the magnetosensitive region thereof. The semiconductor magnetic resistor element includes, for example, a Group III-V compound semiconductor material.

The first magnetic resistor element 212, the second magnetic resistor element 312, the third magnetic resistor element 214 and the fourth magnetic resistor element 314 may be arranged in accordance with the cycles of the protrusions and/or depressions of the rotator 10. For example, as shown in FIG. 2, the first magnetic resistor element 212 and the third magnetic resistor element 214 are arranged in such a manner that, when the third magnetic resistor element 214 faces the first tooth 12, which is a protrusion of the rotator 10, the first magnetic resistor element 212 faces the space between the first tooth 12 and the second tooth 14. Here, the space between the first tooth 12 and the second tooth 14 is a depression of the rotator 10 or an intermediate portion between two protrusions.

Since the magnetic-field generating unit 20 faces the rotator 10, the shortest distance between the rotator 10 and the magnetic-field generating unit 20 is found between the first tooth 12 and the magnetic-field generating unit 20 in FIG. 2. In other words, the magnetic flux density takes the maximum value within the range of its variation in the region between the tooth surface, which is perpendicular to the radial direction of the rotator, of the tooth tip of the first tooth 12 and the magnetic-field generating unit 20. Here, the tooth surface of the tooth tip is referred to as the tooth tip surface. As is seen from the example shown in FIG. 2, if the third magnetic resistor element 214 is positioned in this region, the resistance of the third magnetic resistor element 214 takes the maximum value within the range of its variation according to the magnetic flux density applied to the third magnetic resistor element 214.

The distance between the rotator 10 and the magnetic-field generating unit 20 is large between the depression of the rotator 10 and the magnetic-field generating unit 20. In other words, the magnetic flux density can take the minimum value within the range of its variation, in the region between the depression of the rotator 10 and the magnetic-field generating unit 20. That is to say, if the first magnetic resistor element 212 is positioned in this region, the resistance of the first magnetic resistor element 212 takes the minimum value within the range of its variation according to the magnetic flux density applied to the first magnetic resistor element 212. Accordingly, when the rotator 10 is positioned as shown in the example of FIG. 2, the voltage output from the first terminal 250 is equal to the maximum value in the range of the variation in the voltage obtained by dividing the power source voltage in the detector apparatus 110.

Likewise, the second magnetic resistor element 312 and the fourth magnetic resistor element 314 are arranged next to each other along the moving direction of the rotator 10 in accordance with the cycles of the cyclically arranged protrusions and/or depressions of the rotator 10. In FIG. 2, the second magnetic resistor element 312 is positioned between the protrusion and the depression of the rotator 10. The fourth magnetic resistor element 314 is also positioned between the protrusion and the depression of the rotator 10.

Accordingly, the magnetic flux density applied to the second magnetic resistor element 312 and the fourth magnetic resistor element 314 is positioned at the midpoint between the magnetic flux density applied to the first magnetic resistor element 212 and the magnetic flux density applied to the third magnetic resistor element 214. For example, when the first magnetic resistor element 212, the second magnetic resistor element 312, the third magnetic resistor element 214 and the fourth magnetic resistor element 314 are arranged in the stated order at equal intervals in the moving direction of the rotator 10, the resistances of the second magnetic resistor element 312 and the fourth magnetic resistor element 314 are both positioned at substantially the midpoint within the range of the variation in the resistance.

Note that the first magnetic resistor element 212, the second magnetic resistor element 312, the third magnetic resistor element 214 and the fourth magnetic resistor element 314 have substantially the same initial resistance at zero magnetic field and the resistances thereof vary at substantially the same rate depending on the magnetic flux density. In this manner, when the rotator 10 is positioned as shown in the example of FIG. 2, the voltage output from the second terminal 350 is substantially equal to half the power source voltage in the detector apparatus 110. Since the rotator 10 moves in the moving direction indicated by the arrow in FIG. 2 relative to the detector apparatus 110 described above, the magnetic flux density applied to each of the magnetic resistor elements increases or decreases depending on the positions of the protrusions and/or depressions of the rotator 10. Accordingly, the voltages output from the first terminal 250 and the second terminal 350 also increase or decrease.

Figure 3:
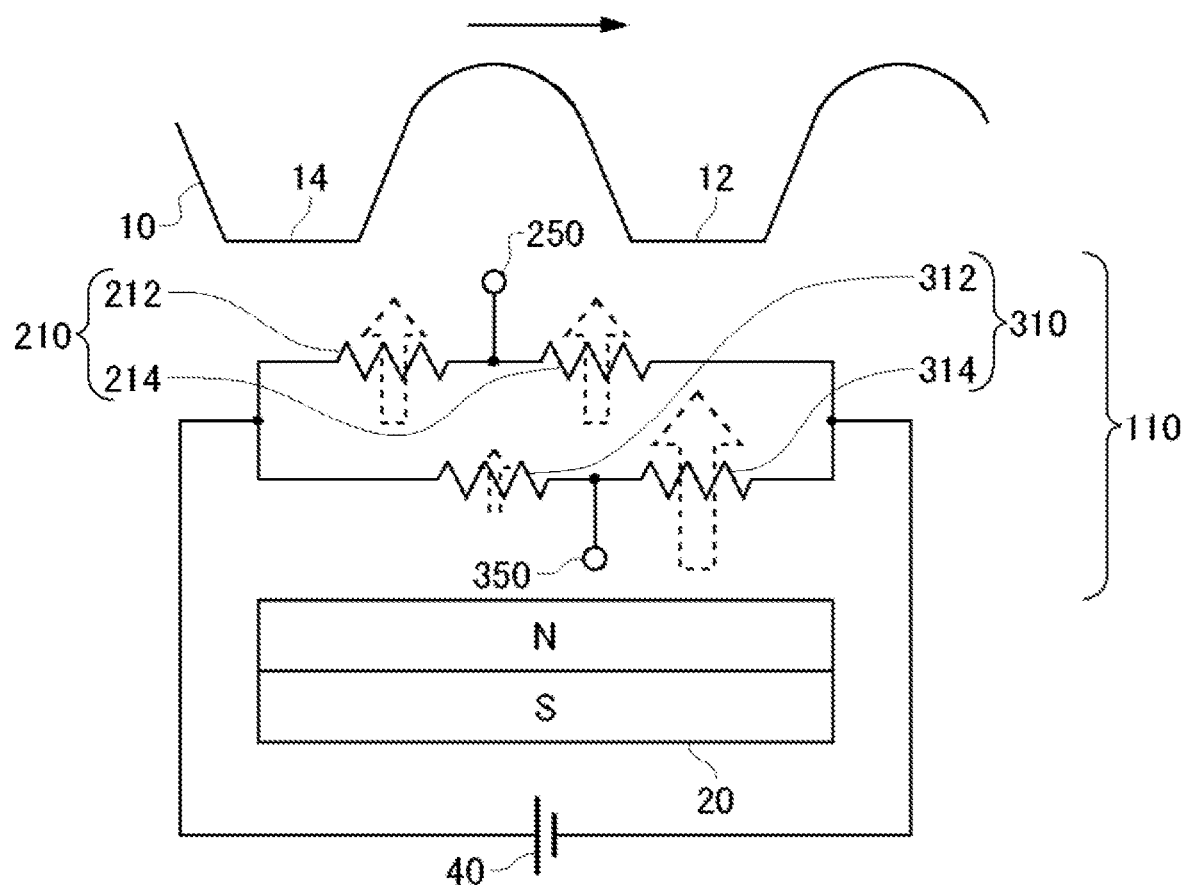
FIG. 3 shows an exemplary configuration of the detector system 100 observed when a rotator 10 shown in FIG. 2 has moved in a moving direction.

FIG. 3 shows an exemplary configuration of the detector system 100 observed when the rotator 10 shown in FIG. 2 has moved in the moving direction. Referring to the detector system 100 shown in FIG. 3, the constituents that operate in substantially the same manner as the corresponding constituents of the detector system 100 shown in FIG. 2 are assigned with the identical reference numerals and not described here. FIG. 3 shows an exemplary case where the rotator 10 has moved to such a position that the second magnetic resistor element 312 faces a depression and the fourth magnetic resistor element 314 faces the first tooth 12, which is a protrusion.

In other words, the resistance of the second magnetic resistor element 312 takes the minimum value and the resistance of the fourth magnetic resistor element 314 takes the maximum value. Accordingly, when the rotator 10 is positioned as shown in the example of FIG. 3, the voltage output from the second terminal 350 is equal to the maximum value in the range of the variation in the voltage obtained by dividing the power source voltage in the detector apparatus 110. In other words, the voltage output from the second terminal 350 in the exemplary case shown in FIG. 3 is substantially equal to the voltage output from the first terminal 250 in the exemplary case shown in FIG. 2 in the detector apparatus 110.

In FIG. 3, the first magnetic resistor element 212 and the third magnetic resistor element 214 are both positioned between the protrusion and the depression of the rotator 10. This means that the resistances of the first magnetic resistor element 212 and the third magnetic resistor element 214 are both positioned at substantially the midpoint within the range of the variation in the resistance. Accordingly, when the rotator 10 is positioned as shown in the example of FIG. 3, the voltage output from the first terminal 250 is substantially equal to half the power source voltage in the detector apparatus 110.

Figure 4:
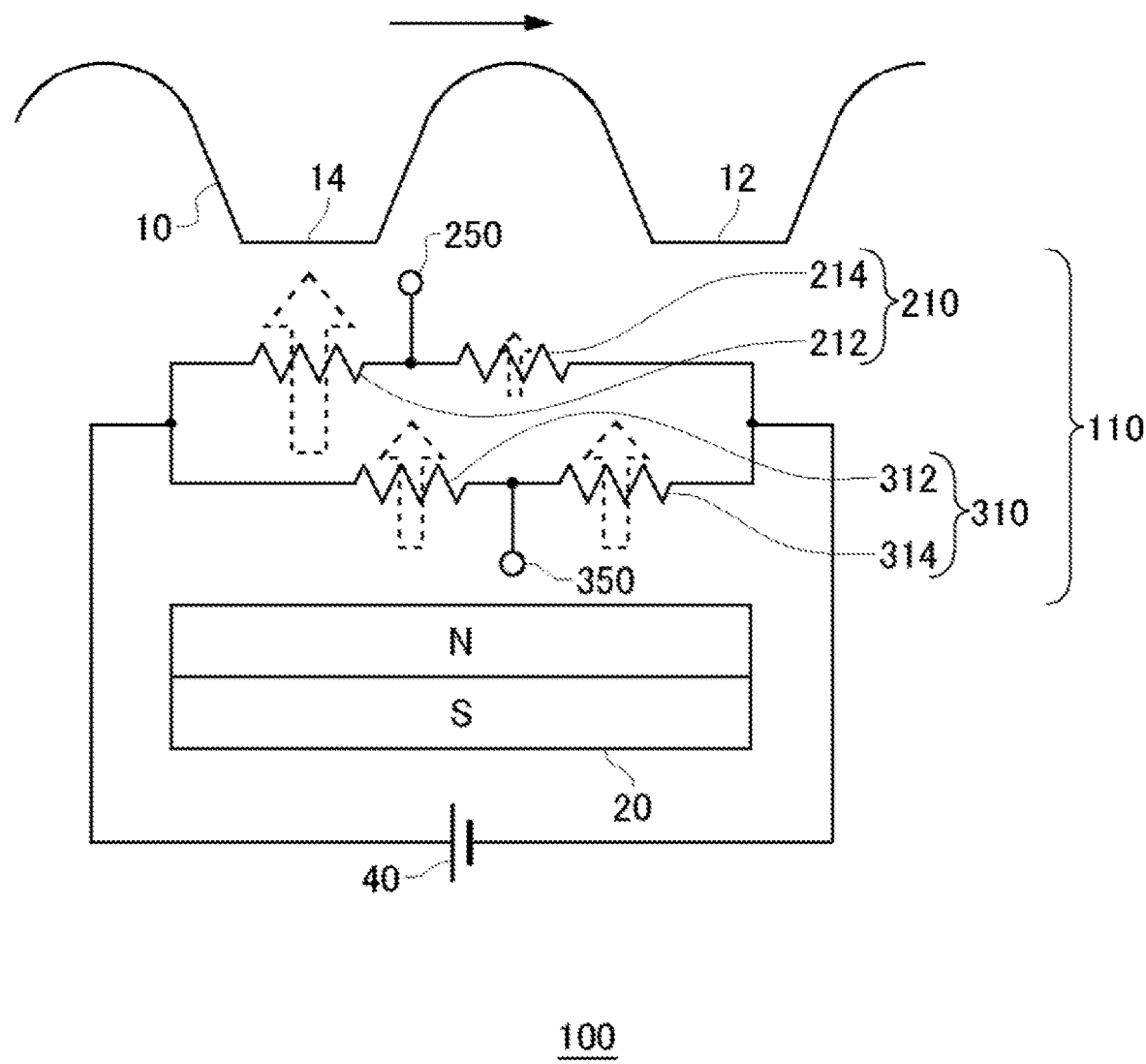
FIG. 4 shows an exemplary configuration of the detector system 100 observed when the rotator 10 shown in FIG. 3 has moved in the moving direction.

FIG. 4 shows an exemplary configuration of the detector system 100 observed when the rotator 10 shown in FIG. 3 has moved in the moving direction. Referring to the detector system 100 shown in FIG. 4, the constituents that operate in substantially the same manner as the corresponding constituents of the detector system 100 shown in FIGS. 2 and 3 are assigned with the identical reference numerals and not described here. FIG. 4 shows an exemplary case where the rotator 10 has moved to such a position that the second magnetic resistor element 312 and the fourth magnetic resistor element 314 are both positioned between the protrusion and the depression of the rotator 10.

In other words, the resistances of the second magnetic resistor element 312 and the fourth magnetic resistor element 314 are both positioned at substantially the midpoint within the range of the variation in the resistance. Accordingly, when the rotator 10 is positioned as shown in the example of FIG. 4, the voltage output from the second terminal 350 is substantially equal to half the power source voltage in the detector apparatus 110. In other words, the voltage output from the second terminal 350 in the exemplary case shown in FIG. 4 is substantially equal to the voltage output from the first terminal 250 in the exemplary case shown in FIG. 3 in the detector apparatus 110.

In FIG. 4, the first magnetic resistor element 212 faces the second tooth 14, which is the protrusion, and the third magnetic resistor element 214 faces the depression. This means that the resistance of the first magnetic resistor element 212 takes the maximum value and the resistance of the third magnetic resistor element 214 takes the minimum value. Accordingly, when the rotator 10 is positioned as shown in the example of FIG. 4, the voltage output from the second terminal 350 is equal to the minimum value in the range of the variation in the voltage obtained by dividing the power source voltage in the detector apparatus 110.

Figure 5:
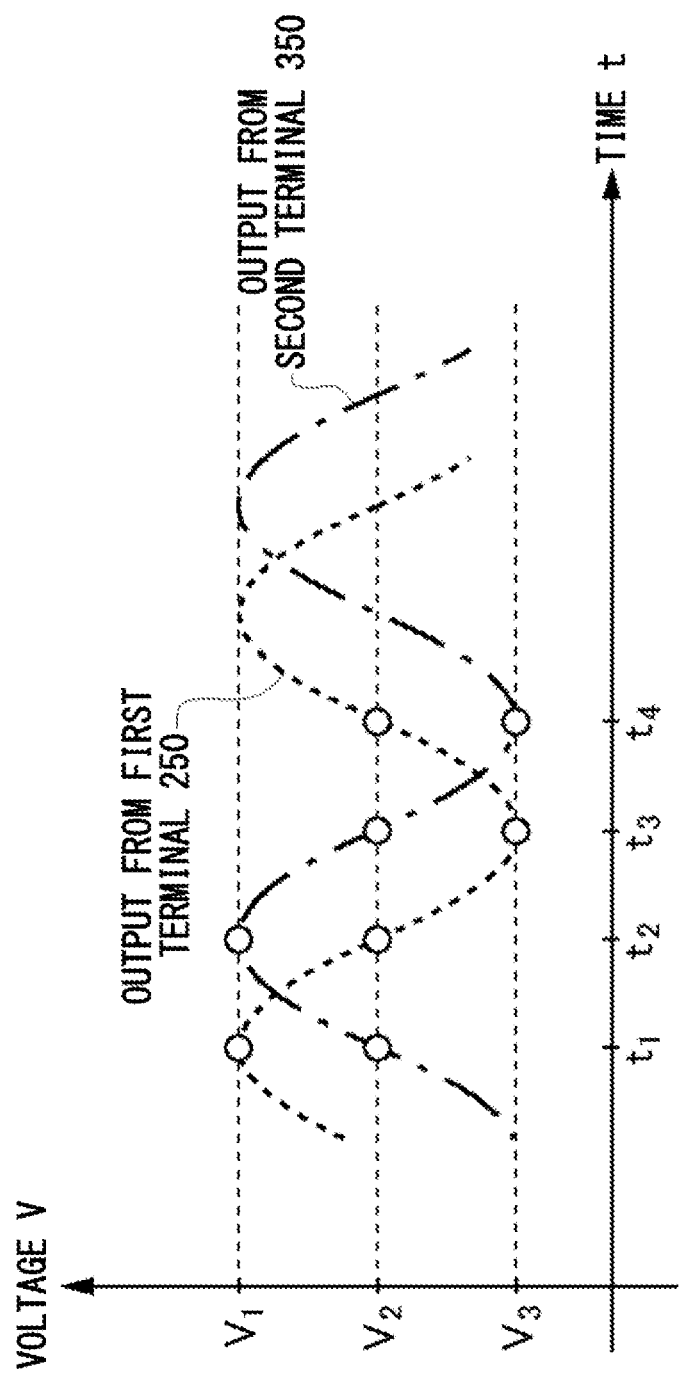
FIG. 5 shows, as an example, detection signals output from the detector apparatus 110 in accordance with the embodiment of the present invention.

FIG. 5 shows, as an example, the detection signals output from the detector apparatus 110. In FIG. 5, the horizontal axis represents the time t, and the vertical axis represents the voltage value V of the detection signal. FIG. 5 separately plots, as an example, the voltage of the detection signals output from the first terminal 250 and the second terminal 350. For example, a timing $t_1$ is shown as an exemplary timing at which the rotator 10 is positioned relative to the detector apparatus 110 as shown in FIG. 2. In this case, the first terminal 250 outputs a voltage $V_1$, which is equal to the maximum value in the range of the variation in the voltage, and the second terminal 350 outputs a voltage $V_2$, which is equal to the midpoint value in the range of the variation in the voltage.

A timing $t_2$ is shown as an exemplary timing at which the rotator 10 has moved relative to the detector apparatus 110 from the position shown in FIG. 2 to the position shown in FIG. 3. In this case, the first terminal 250 outputs the voltage $V_2$, which is equal to the midpoint value in the range of the variation in the voltage, and the second terminal 350 outputs the voltage $V_1$, which is equal to the maximum value in the range of the variation in the voltage. A timing $t_3$ is shown as an exemplary timing at which the rotator 10 has moved relative to the detector apparatus 110 from the position shown in FIG. 3 to the position shown in FIG. 4. In this case, the first terminal 250 outputs a voltage $V_3$, which is equal to the minimum value in the range of the variation in the voltage, and the second terminal 350 outputs the voltage $V_2$, which is equal to the midpoint value in the range of the variation in the voltage.

As described above, the circular motion of the rotator 10 at a constant velocity around the rotation axis causes a cosine wave signal and a sine wave signal to be respectively output as the detection signals from the first terminal 250 and the second terminal 350. Accordingly, the detector apparatus 110 can detect the rotational angle between the adjacent ones of the teeth (the electric angle) by obtaining an arc tangent from the voltages of the detection signals output from the first terminal 250 and the second terminal 350. Additionally, the detector apparatus 110 can detect the rotational speed of the rotator 10 based on the cycle of the detection signal output from the first terminal 250 and/or the second terminal 350. Furthermore, the detector apparatus 110 can detect the number of rotations of the rotator 10 based, for example, on the number of times at which the peak value of the sine wave signal is detected. Here, even if the rotator 10 does not rotate at a constant velocity, the detection signals vary as the positions of the teeth move as a result of the rotation of the rotator 10. Accordingly, the detector apparatus 110 can detect that the rotator 10 has moved in a relative manner, by referring to the variation in the detection signals.

As shown in FIGS. 2 to 4, it is the first magnetic resistor element 212, from among the magnetic resistor elements, that first faces a new tooth of the gear as the rotator 10 rotates. Therefore, the phase of the detection signal output from the first terminal 250 is advanced compared with the phase of the detection signal output from the second terminal 350. Here, when the rotator 10 rotates in the reverse direction, it is the fourth magnetic resistor element 314, from among the magnetic resistor elements, that first faces a new tooth of the gear as the rotator 10 rotates. Accordingly, in the case of the reverse rotation, the phase of the detection signal output from the first terminal 250 is delayed compared with the phase of the detection signal output from the second terminal 350. This means that the detector apparatus 110 can detect the rotational direction of the rotator 10 by comparing the phases of the detection signals output from the first terminal 250 and the second terminal 350.

Figure 6:
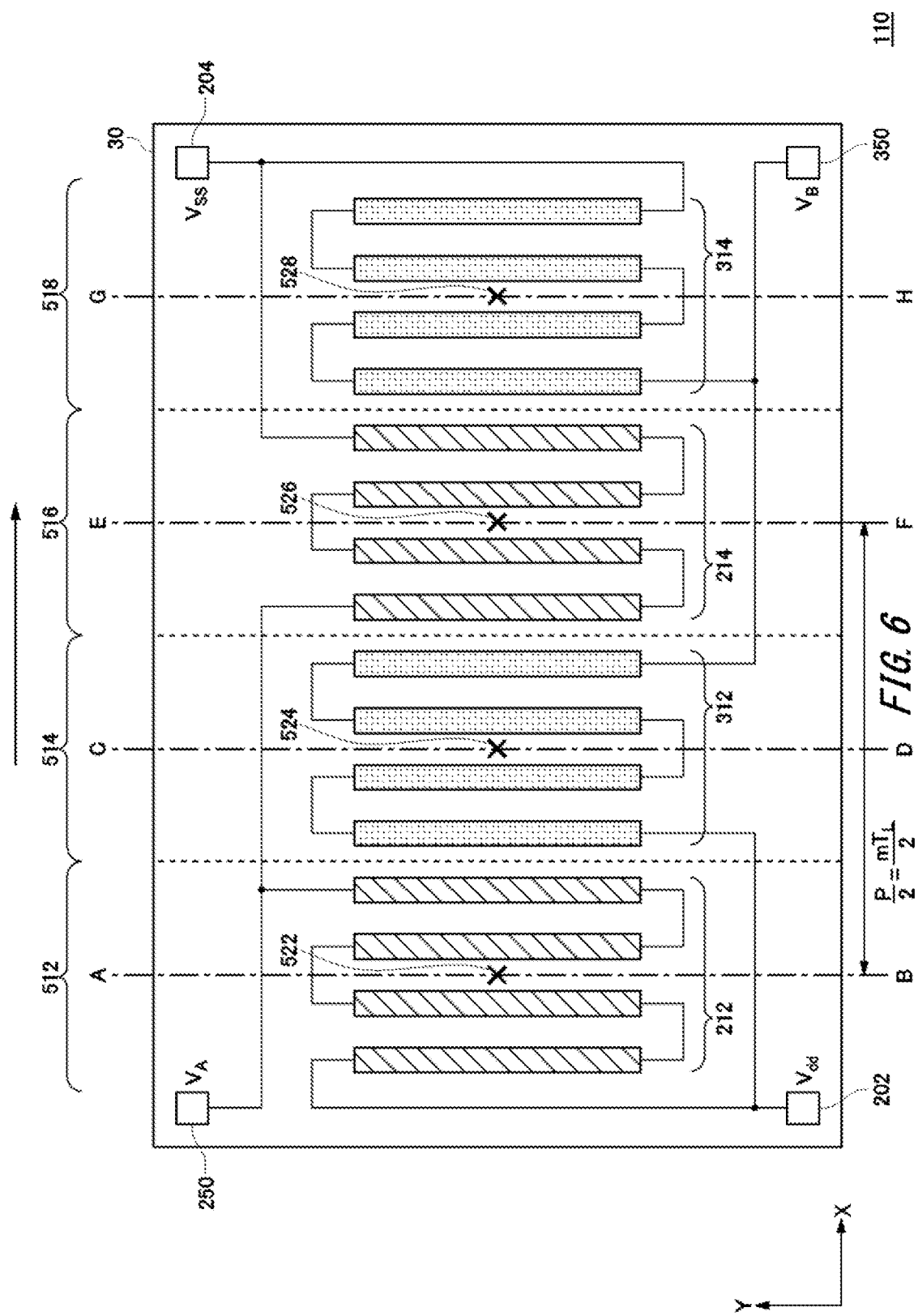
FIG. 6 shows an exemplary configuration of the detector apparatus 110.

FIG. 6 shows an exemplary configuration of the detector apparatus 110. In FIG. 6, the X axis represents the moving direction of the rotator 10, and the Y axis represents the direction orthogonal to the moving direction. The detector apparatus 110 includes a substrate 30, and the magnetosensitive regions and the like are formed on the surface of the substrate 30 that is substantially parallel to the X-Y plane. The substrate 30 is, for example, a substrate made of a semiconductor, glass, ceramic and the like. On the surface of the substrate 30, a first potential terminal 202, a second potential terminal 204, the first magnetic resistor element 212, the third magnetic resistor element 214, the first terminal 250, the second magnetic resistor element 312, the fourth magnetic resistor element 314 and the second terminal 350 are formed.

The first potential terminal 202 is connected to one of the terminals of the power source 40 and receives the delivery of the first potential. The second potential terminal 204 is connected to the other terminal of the power source 40 and receives the delivery of the second potential. The first terminal 250 outputs a detection signal $V_A$ and the second terminal 350 outputs a detection signal $V_B$ having a different phase than the detection signal $V_A$.

In FIG. 6, the arrow indicates the moving direction of the rotator 10. The first magnetic resistor element 212, the second magnetic resistor element 312, the third magnetic resistor element 214 and the fourth magnetic resistor element 314 should be provided on the surface of the substrate 30 that is configured to face the rotator 10. The first magnetic resistor element 212, the second magnetic resistor element 312, the third magnetic resistor element 214 and the fourth magnetic resistor element 314 are formed in such a manner that there is at least partial overlap between, in the width direction (the Y direction) orthogonal to the moving direction of the rotator 10, the areas in which their respective magnetosensitive regions are provided.

FIG. 6 shows an exemplary case where the first magnetic resistor element 212, the second magnetic resistor element 312, the third magnetic resistor element 214 and the fourth magnetic resistor element 314 each include four magnetosensitive regions. Here, the magnetosensitive regions are each illustrated as having a substantially rectangular shape extending in the width direction. FIG. 6 shows an exemplary case where the magnetosensitive regions of the resistor elements are arranged at substantially equal intervals in the moving direction of the rotator 10. For example, FIG. 6 shows an exemplary case where the magnetosensitive regions are positioned in such a manner that a single magnetosensitive region translates in the moving direction of the rotator 10. In this case, the respective areas in which the magnetosensitive regions of the first magnetic resistor element 212, the second magnetic resistor element 312, the third magnetic resistor element 214 and the fourth magnetic resistor element 314 are provided entirely overlap each other in the width direction.

The first magnetic resistor element 212, the second magnetic resistor element 312, the third magnetic resistor element 214 and the fourth magnetic resistor element 314 are respectively formed in a first region 512, a second region 514, a third region 516 and a fourth region 518, which are arranged at equal intervals on the substrate 30. The distance between the centers of the first region 512, the second region 514, the third region 516 and the fourth region 518 is substantially equal to the value obtained by multiplying quarter the circular pitch of the gear of the rotator 10 by a coefficient determined according to the distance between the rotator 10 and the detector apparatus 110. For example, when the gear has a module m=d/z, the circular pitch p of the gear is p=mπ. Here, d denotes the diameter of the reference pitch circle, z denotes the number of teeth and the circular pitch p is obtained by dividing the circumference (πd) by the number of teeth z.

Since the multiple resistor elements are arranged at intervals corresponding to the circular pitch of the gear in the moving direction of the rotator 10, each resistor element can face a corresponding one of the tooth tip surfaces at a corresponding timing during the rotation of the gear. FIG. 6 shows an exemplary case where the first magnetic resistor element 212 is formed in the first region 512, the second magnetic resistor element 312 is formed in the second region 514, the third magnetic resistor element 214 is formed in the third region 516, and the fourth magnetic resistor element 314 is formed in the fourth region 518.

The cross marks each indicate, as an example, the location of the center of all the magnetosensitive regions (the magnetosensitive surface) of a corresponding one of the magnetic resistor elements. For example, the center of the magnetosensitive surface of the first magnetic resistor element 212 is a location 522, the center of the magnetosensitive surface of the second magnetic resistor element 312 is a location 524, the center of the magnetosensitive surface of the third magnetic resistor element 214 is a location 526, and the center of the magnetosensitive surface of the fourth magnetic resistor element 314 is a location 528. The first magnetic resistor element 212, the second magnetic resistor element 312, the third magnetic resistor element 214 and the fourth magnetic resistor element 314 are arranged on the substrate 30 in such a manner that the locations of the centers of the magnetosensitive surfaces are arranged at equal intervals in the moving direction of the rotator 10.

With such configurations, while the rotator 10 is rotating, for example, the first magnetic resistor element 212 can face the tooth tip surface of the first tooth of the gear at a first timing, and the second magnetic resistor element 312 can face the tooth tip surface of the first tooth of the gear at the next second timing. As described above, the respective regions of the multiple magnetic resistor elements can face the tooth tip surface of the first tooth of the gear one by one in the order of their arrangement in the moving direction as the time elapses. Likewise, the respective regions of the multiple magnetic resistor elements can face the depressions of the rotator 10 in the order of their arrangement in the moving direction as the time elapses. As a result, the detector apparatus 110 can accurately detect the movement of the rotator 10 and output the detected result in the form of the detection signal.

In the above-described manner, the detector system 100 can detect the rotation of the rotator 10. However, the detector system 100 having the above-described configuration may be required to have a small size. Furthermore, the to-be-detected unit or rotator 10 may have a smaller size. In this case, magnetic fields of different magnitudes may be applied by the magnetic-field generating unit 20 to the respective magnetic resistor elements since the respective magnetic resistor elements are positioned at different distances from the rotator 10. This exemplary case is described in the following.

Figure 7:
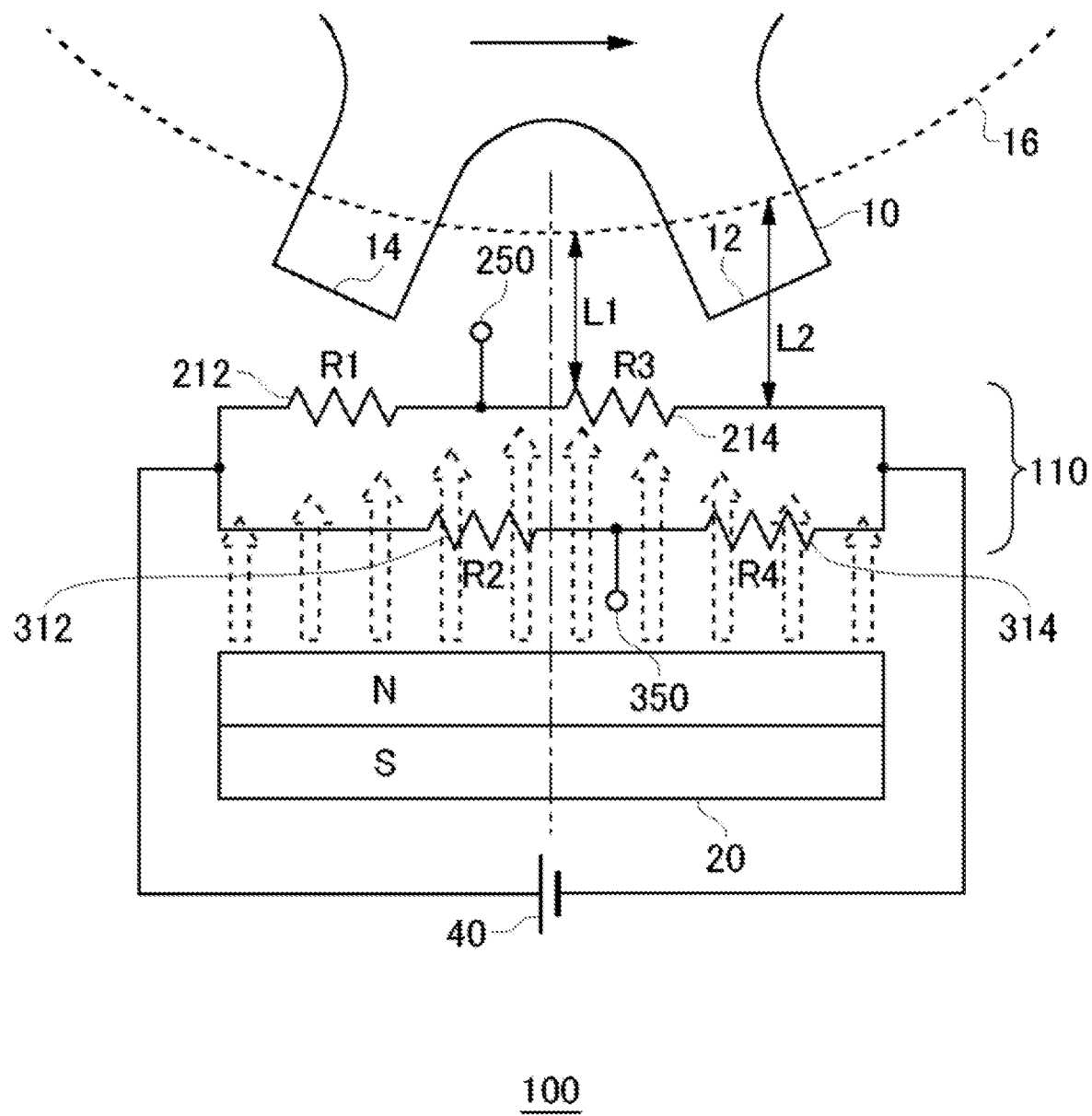
FIG. 7 shows an exemplary configuration of the detector system 100 that is reduced in size.

FIG. 7 shows an exemplary configuration of the detector system 100 that is reduced in size. Referring to the detector system 100 shown in FIG. 7, the constituents that operate in substantially the same manner as the corresponding constituents of the detector system 100 shown in FIGS. 2 to 4 are assigned with the identical reference numerals and not described here. FIG. 7 shows an exemplary case where the diameter of the rotator 10 is smaller than the diameter of the rotator 10 in the detector system 100 shown in FIGS. 2 to 4.

The detector apparatus 110 can be desirably used to detect the movement of the small-sized rotator 10. Here, the magnetic field generated by the magnetic-field generating unit 20 desirably exhibits a substantially uniform magnetic flux density across the entire region of the magnetosensitive portions of the magnetosensitive region in the detector apparatus 110. However, the magnetic flux density may be lower at the peripheral portion of the magnetic-field generating unit 20 than at the central portion. For example, when the magnetic-field generating unit 20 is a permanent magnet shaped like a cuboid, the magnetic field applied by the magnetic-field generating unit 20 to the detector apparatus 110 is such that the highest magnetic flux density is generated from the central portion of the rectangular surface that faces the rotator 10 and the magnetic flux density decreases toward the peripheral portion. This tendency is enhanced if the rotator 10 is reduced in size. FIG. 7 shows an exemplary case where the magnetic field generated by the magnetic-field generating unit 20 has a magnetic flux density distribution in the moving direction of the rotator 10.

Here, it is desirable that the central portion of the detector apparatus 110 is substantially aligned with the central portion of the magnetic-field generating unit 20 in the moving direction of the rotator 10. FIG. 7 shows an exemplary case where the center of the detector apparatus 110 is substantially aligned with the center of the magnetic-field generating unit 20 at the position indicated by the alternate long and short dash line. In this case, in the moving direction of the rotator 10, the distance from the location of the center to the third magnetic resistor element 214 is shorter than the distance from the location of the center to the first magnetic resistor element 212.

Accordingly, even if the detector apparatus 110 is spaced away from the rotator 10 and no variation is induced in the magnetic flux density by the rotator 10, there is a difference in the magnitude of the magnetic flux density applied by the magnetic-field generating unit 20 between the first magnetic resistor element 212 and the second magnetic resistor element 312. In this case, even if the detector apparatus 110 is not placed in the vicinity of the rotator 10, the voltage output from the first terminal 250 is different from the midpoint voltage between the first potential and the second potential. Here, the difference between the voltage generated when the magnetic field generated by the magnetic-field generating unit 20 is applied to the detector apparatus 110 and the midpoint voltage between the first potential and the second potential is referred to as the offset voltage.

Likewise, in the moving direction of the rotator 10, the distance from the location of the center to the second magnetic resistor element 312 is shorter than the distance from the location of the center to the fourth magnetic resistor element 314. Accordingly, the voltage output from the second terminal 350 is equal to the result of adding the offset voltage to the midpoint voltage between the first potential and the second potential. Here, the offset voltages included in the potentials respectively output from the first terminal 250 and the second terminal 350 have substantially the same absolute value and different ones of the positive and negative signs. For example, a positive offset is superimposed in the detection signal $V_A$ from the first terminal 250 shown in FIG. 5, and a negative offset is superimposed in the detection signal $V_B$ from the second terminal 350. Here, the above-mentioned offset voltages, which are induced by the inclusion of the magnet, can be reduced by determining the size of the magnet of the magnetic-field generating unit 20 so as to achieve a uniform magnetic flux density across the region of the magnetosensitive portions (see, for example, Japanese Patent No. 4308084).

If the size of the rotator 10 is reduced, the curvature of the rotator 10 increases. This means that the average distances between the rotator 10 and the respective magnetic resistor elements in the detector apparatus 110 tend to be significantly different from each other. In FIG. 7, the dotted line indicates a reference pitch circle 16 of the rotator 10. Regarding the distance between the detector apparatus 110 and the reference pitch circle 16, a distance L2 at the location distant from the location of the center is larger than a distance L1 at the location near the location of the center, for example. Accordingly, the magnetic flux density of the magnetic field from the magnetic-field generating unit 20 to the rotator 10 increases as the location is moved toward the location of the center under the assumption that the rotator 10 has no protrusions or depressions. Such a location-dependent distribution of the magnetic flux density increases as the curvature of the rotator 10 increases or as the distance between the magnetic-field generating unit 20 and the rotator 10 decreases. In this case, it is difficult to reduce the offset voltages only by adjusting the size of the magnet of the magnetic-field generating unit 20.

In the foregoing description, the offset voltage is defined as the difference between the voltage generated when the magnetic field generated by the magnetic-field generating unit 20 is applied to the detector apparatus 110 and the midpoint voltage between the first potential and the second potential. Here, when the rotator 10 is placed in the vicinity of the detector apparatus 110 and moves, the detection signals output from the first terminal 250 and the second terminal 350 are as shown in FIG. 5. Accordingly, the offset voltage is redefined as meaning the difference between the temporal average voltage of each of the detection signals and the midpoint voltage between the first potential and the second potential. Therefore, the absolute values of the offset voltages of the first terminal 250 and the second terminal 350 tend to increase as the distance between the magnetic-field generating unit 20 and the rotator 10 decreases. Here, the detection signal output from the first terminal 250 is labeled as a first signal and the detection signal output from the second terminal 350 is labeled as a second signal. The following describes the tendency of the offset voltages of the first signal and the second signal.

Figure 8:
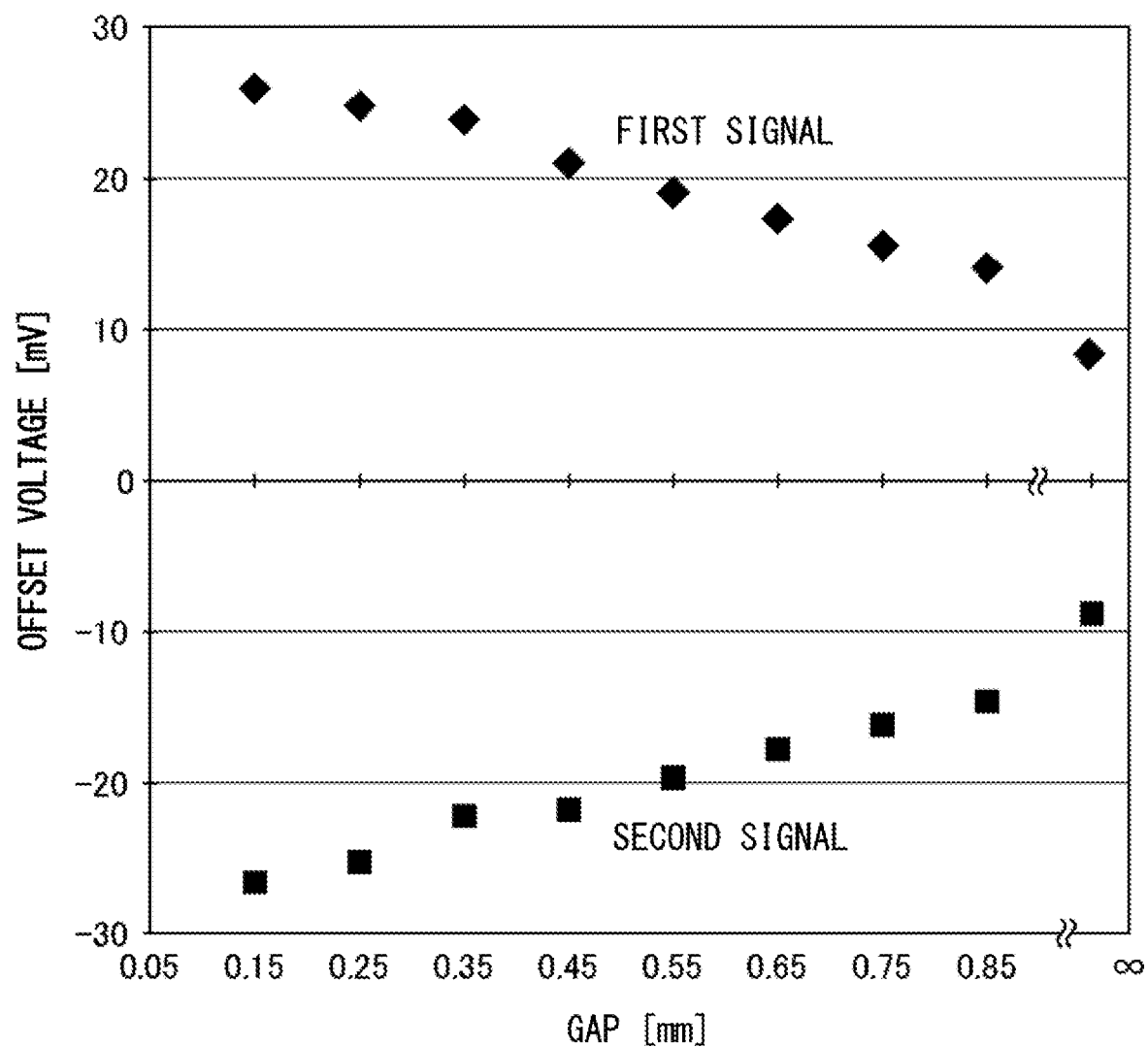
FIG. 8 shows, as an example, offset voltages for a first signal and a second signal output from the detector apparatus 110.

FIG. 8 shows, as an example, the offset voltages for the first signal and the second signal output from the detector apparatus 110. FIG. 8 shows, as an example, the results of simulations performed under such conditions that the gear has 64 teeth, has a module of 0.4, and is made of S45C, and the magnet is made of SmCo. In FIG. 8, the horizontal axis represents the distance between the rotator 10 and the detector apparatus 110, which is referred to as the gap. In FIG. 8, the vertical axis represents the offset voltage. Note that the initial conditions for the simulations shown in FIG. 8 include such conditions that the initial value of the offset voltages is 0 V in the zero-magnetic-field environment in which the detector apparatus 110 is spaced away from the magnetic-field generating unit 20 and the rotator 10 and the magnetic-field generating unit 20 is not provided.

FIG. 8 shows an exemplary case where the offset voltages are generated since the magnetic-field generating unit 20 is placed in the vicinity of the detector apparatus 110 with the detector apparatus 110 being kept spaced away from the rotator 10. The offset voltages generated under these conditions correspond to the offset voltages observed when the gap, represented by the horizontal axis, is ∞. FIG. 8 shows an exemplary case where the offset voltage of the first signal has a positive value and the offset voltage of the second signal has a negative side.

FIG. 8 shows that, as the distance between the detector apparatus 110 and the rotator 10 decreases, the absolute values of these offset voltages increase. If the generated offset voltages exceed several dozen mV as shown in FIG. 8, the detector apparatus 110 may make errors in detecting the rotation. In addition, such offset voltages may result in deterioration of the dynamic range, the S/N and the like. Therefore, the detector apparatus 110 relating to the present embodiment is configured to reduce or prevent the generation of such offset voltages.

Figure 9:
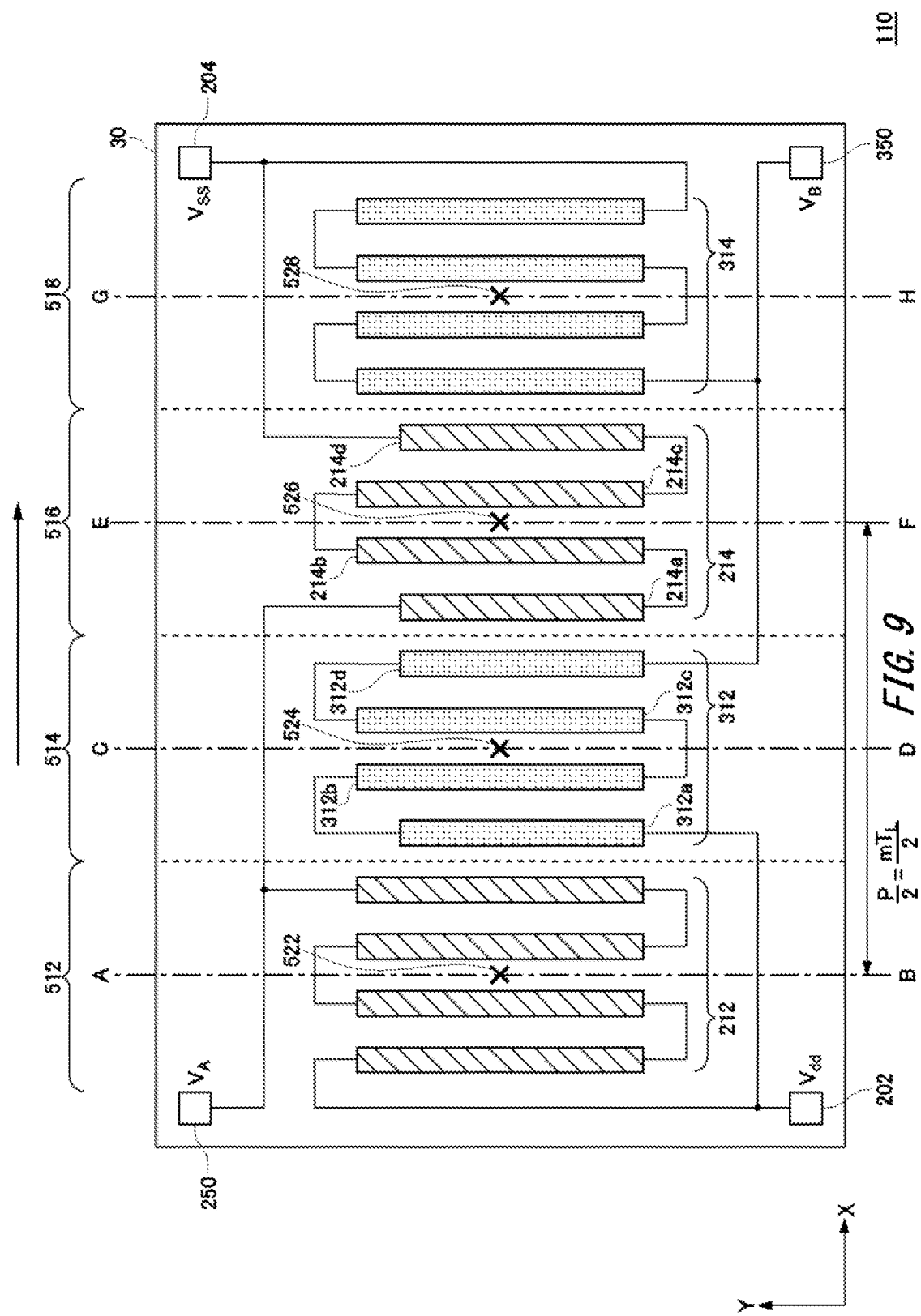
FIG. 9 shows an exemplary configuration of the detector apparatus 110 in accordance with the embodiment of the present invention.

FIG. 9 shows an exemplary configuration of the detector apparatus 110 in accordance with the embodiment of the present invention. Referring to the detector apparatus 110 shown in FIG. 9, the constituents that operate in substantially the same manner as the corresponding constituents of the detector apparatus 110 shown in FIG. 6 are assigned with the identical reference numerals and not described here. In the detector apparatus 110 relating to the present embodiment, in terms of the moving direction of the rotator 10, the magnetic resistor element that is positioned close to the central axis of the detector apparatus 110 has a lower resistance for the same magnetic field than the magnetic resistor element that is positioned distant from the central axis.

To be specific, the third magnetic resistor element 214 is formed to originally have a lower resistance for the same magnetic field than the first magnetic resistor element 212, and the second magnetic resistor element 312 is formed to originally have a lower resistance for the same magnetic field than the fourth magnetic resistor element 314. In this case, the third magnetic resistor element 214 may have a different shape than the first magnetic resistor element 212, and the second magnetic resistor element 312 may have a different shape than the fourth magnetic resistor element 314. Alternatively, the respective magnetic resistor elements may have different thicknesses and/or may be made of different materials.

For example, the third magnetic resistor element 214 has such a shape that at least a portion of the third magnetic resistor element 214 is shorter than the first magnetic resistor element 212 in the direction orthogonal to the moving direction of the rotator 10. FIG. 9 shows an exemplary case where the third magnetic resistor element 214 includes four magnetosensitive regions, i.e., a magnetosensitive region 214a, a magnetosensitive region 214b, a magnetosensitive region 214c and a magnetosensitive region 214d, and the magnetosensitive region 214a and the magnetosensitive region 214d are shorter in the Y direction. With such configurations, the resistance of the third magnetic resistor element 214 can be lowered by rarely changing the location 526 of the center of the magnetosensitive surface in the moving direction of the rotator 10. Here, it may be allowed to move the location 526 of the center of the magnetosensitive surface, for example, on the center line EF of the third region 516, which corresponds to the Y direction.

Likewise, the second magnetic resistor element 312 has such a shape that at least a portion of the second magnetic resistor element 312 is shorter than the fourth magnetic resistor element 314 in the direction orthogonal to the moving direction of the rotator 10. FIG. 9 shows an exemplary case where the second magnetic resistor element 312 includes four magnetosensitive regions, i.e., a magnetosensitive region 312a, a magnetosensitive region 312b, a magnetosensitive region 312c and a magnetosensitive region 312d, and the magnetosensitive region 312a and the magnetosensitive region 312d are shorter in the Y direction. With such configurations, the resistance of the second magnetic resistor element 312 can be lowered by rarely changing the location 524 of the center of the magnetosensitive surface in the moving direction of the rotator 10. Here, it may be allowed to move the location 524 of the center of the magnetosensitive surface, for example, on the center line CD of the second region 514, which corresponds to the Y direction.

In the above-described manner, in the detector apparatus 110 relating to the present embodiment, while the resistances of the magnetic resistor elements are adjusted, the magnetic resistor elements can be arranged on the substrate 30 next to each other in the moving direction of the rotator 10 in such a manner that the centers of their magnetosensitive surfaces are positioned at equal intervals. Note that the manner of adjusting the resistances of the second magnetic resistor element 312 and the third magnetic resistor element 214 is not limited to the exemplary configuration shown in FIG. 9. Any alternative manners can be employed as long as the centers of the magnetosensitive surfaces are not changed in the moving direction of the rotator 10. For example, all of the four magnetosensitive surfaces may be reduced in length. As another alternative example, the magnetosensitive regions close to the central axis in each region (for example, the magnetosensitive region 214b and the magnetosensitive region 214c) may be reduced in length.

In order to form the above-described magnetosensitive regions, magnetosensitive regions that have predetermined different lengths may be formed on the substrate 30. Alternatively, magnetosensitive regions that have predetermined substantially the same length are first formed on the substrate 30 and then the formed magnetosensitive regions may be at least partially trimmed to finely adjust their lengths. The following describes the offset voltages generated in the detector apparatus 110 having the above-described configurations.

Figure 10:
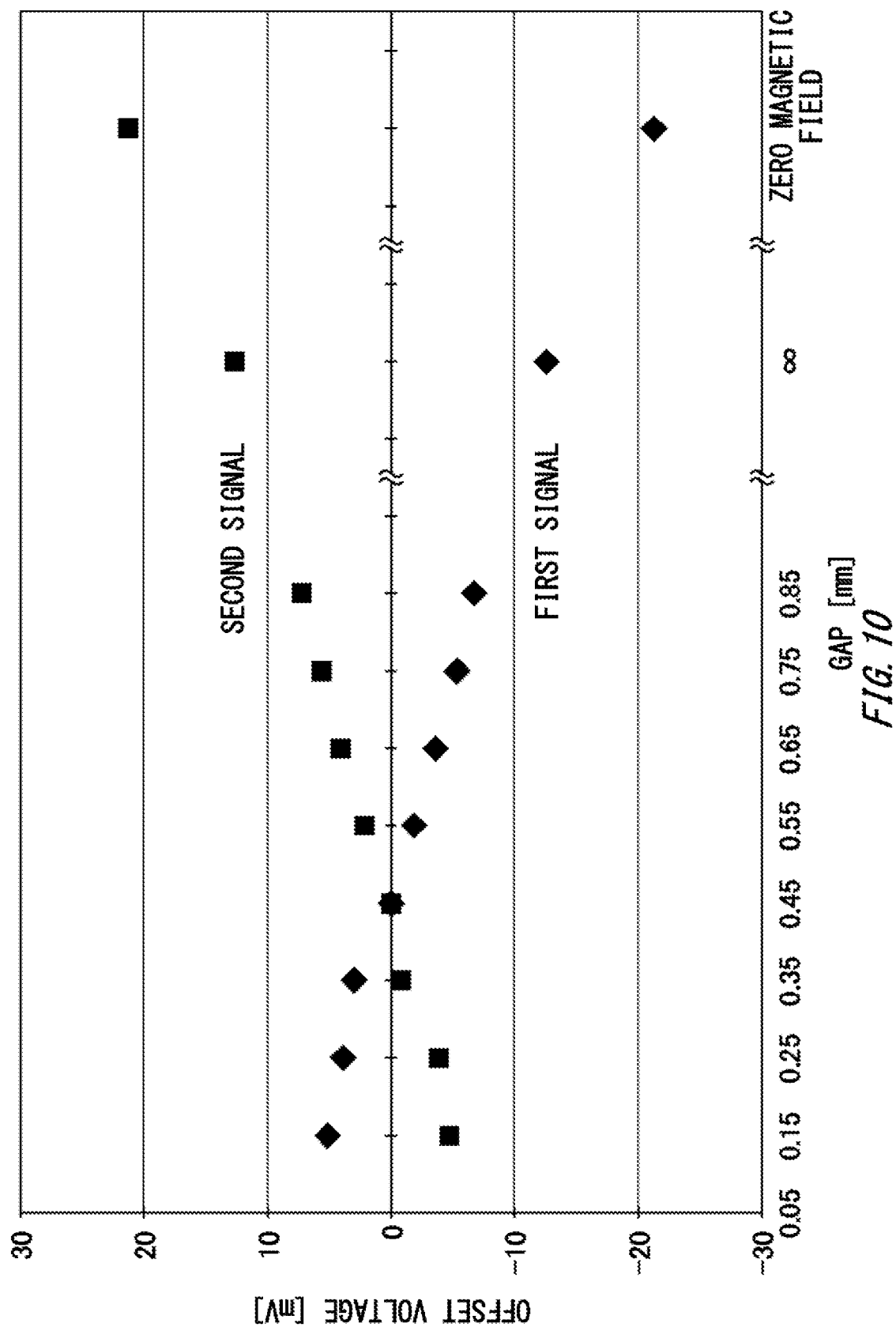
FIG. 10 shows, as an example, the offset voltages for the first signal and the second signal output from the detector apparatus 110 in accordance with the embodiment of the present embodiment.

FIG. 10 shows, as an example, the offset voltages for the first signal and the second signal output from the detector apparatus 110 in accordance with the embodiment of the present embodiment. As in FIG. 8, FIG. 10 shows, as an example, the results of simulations performed under such conditions that the gear has 64 teeth, has a module of 0.4, and is made of S45C, and the magnet is made of SmCo. In FIG. 10, the horizontal axis represents the distance between the magnetic-field generating unit 20 and the rotator 10. In FIG. 10, the vertical axis represents the offset voltage.

Note that, in FIG. 10, the term "ZERO MAGNETIC FIELD" marked along the horizontal axis indicates the offset voltages that are output in the zero-magnetic-field environment in which the detector apparatus 110 is spaced away from the magnetic-field generating unit 20 and the rotator 10. Here, $R_1$, $R_2$, $R_3$ and $R_4$ respectively denote the resistances of the first magnetic resistor element 212, the second magnetic resistor element 312, the third magnetic resistor element 214, and the fourth magnetic resistor element 314 that are observed in the zero-magnetic-field environment in which no magnetic field is applied to the detector apparatus 110.

In the detector apparatus 110 relating to the present embodiment, the respective magnetic resistor elements are formed to originally satisfy the conditions of $R_1 > R_3$ and $R_2 < R_4$. In this manner, the voltage $V_A$ of the first terminal 250 and the voltage $V_B$ of the second terminal 350 at the zero magnetic field are different from the midpoint voltage between the first potential $V_{dd}$ and the second potential $V_{ss}$ as indicated by the following equation.

$$V_A = (V_{dd} - V_{ss}) \cdot R_3 / (R_1 + R_3) < (V_{dd} - V_{ss})/2$$

$$V_B = (V_{dd} - V_{ss}) \cdot R_4 / (R_2 + R_4) > (V_{dd} - V_{ss})/2 \qquad \text{Equation 1}$$

The first magnetic resistor element 212 and the fourth magnetic resistor element 314 may be formed to originally exhibit equal resistances for the same magnetic field. Likewise, the second magnetic resistor element 312 and the third magnetic resistor element 214 may be formed to originally exhibit equal resistances for the same magnetic field. In other words, the respective magnetic resistor elements of the detector apparatus 110 may be formed to originally satisfy the conditions of $R_1=R_4$ and $R_2=R_3$. In this case, a first offset voltage $V_{OS1}$ for the first terminal 250 and a second offset voltage $V_{OS2}$ for the second terminal 350 are calculated as indicated by the following equations, and have different signs but equal absolute values. Here, $V_M$ denotes the midpoint voltage between the first potential $V_{dd}$ and the second potential $V_{ss}$.

$$V_{OS1}=V_A-V_M=V_M(R_3-R_1)/(R_1+R_3)<0$$

$$V_{OS2}=V_B-V_M=V_M(R_4-R_2)/(R_2+R_4)=-V_{OS1}>0$$

$$V_M=(V_{dd}-V_{ss})/2 \qquad \text{Equation 2}$$

As described above, in the zero-magnetic-field environment in which no magnetic field is applied to the detector apparatus 110, the voltage of the first terminal 250 between the first magnetic resistor element 212 and the third magnetic resistor element 214 is different from the midpoint voltage between the first potential and the second potential by the first offset voltage $V_{OS1}$. Considering the relation of $R_1>R_3$, the first offset voltage $V_{OS1}$ is a negative potential. FIG. 10 shows an exemplary case where the first offset voltage $V_{OS1}$ is less than −20 mV.

Likewise, the voltage of the second terminal 350 between the second magnetic resistor element 312 and the fourth magnetic resistor element 314 is different from the midpoint voltage between the first potential and the second potential by the second offset voltage $V_{OS2}$. Considering the relation of $R_4>R_2$, the second offset voltage $V_{OS2}$ is a positive potential. FIG. 10 shows an exemplary case where the second offset voltage $V_{OS2}$ is higher than +20 mV.

Note that, in FIG. 10, the mark "∞" marked along the horizontal axis indicates the offset voltage that is output in the environment in which the magnetic-field generating unit 20 is positioned in the vicinity of the detector apparatus 110 while the detector apparatus 110 remains spaced away from the rotator 10. As described above with reference to FIGS. 7 and 8, the magnetic-field generating unit 20 applies, to the first magnetosensitive unit 210 and the second magnetosensitive unit 310, the magnetic field in which the magnetic flux density gradually increases or decreases in the relative moving direction.

In other words, the magnetic flux density applied to the first magnetic resistor element 212 is lower than the magnetic flux density applied to the third magnetic resistor element 214. Accordingly, as a result of being increased by the magnetic-field generating unit 20, the resistance of the third magnetic resistor element 214 becomes higher than the resistance of the first magnetic resistor element 212. This shifts the first offset voltage $V_{OS1}$ in the positive direction. FIG. 10 shows an exemplary case where the first offset voltage $V_{OS1}$ shifts to approximately −13 mV.

Likewise, the magnetic flux density applied to the fourth magnetic resistor element 314 is lower than the magnetic flux density applied to the second magnetic resistor element 312. Accordingly, as a result of being increased by the magnetic-field generating unit 20, the resistance of the second magnetic resistor element 312 becomes higher than the resistance of the fourth magnetic resistor element 314. This shifts the second offset voltage $V_{OS2}$ in the negative direction. FIG. 10 shows an exemplary case where the second offset voltage $V_{OS2}$ shifts to approximately +13 mV.

As described above, the initial offset voltages are generated in advance at the zero magnetic field in the detector apparatus 110 relating to the present embodiment. In this manner, the application of the magnetic field by the magnetic-field generating unit 20 can cause a change in the first offset voltage $V_{OS1}$ and the second offset voltage $V_{OS2}$ toward 0 V. In other words, the detector apparatus 110 is configured such that the application of the magnetic field by the magnetic-field generating unit 20 changes the initial offset voltages in such a manner that their absolute values decrease.

FIG. 10 plots the offset voltages observed when the rotator 10 and the magnetic-field generating unit 20 are positioned in the vicinity of the detector apparatus 110 to constitute the detector system 100, which are associated with the numbers "0.15" to "0.85" marked along the horizontal axis. As described with reference to FIGS. 7 and 8, as a result of an increase in the curvature of the rotator 10, the magnetic field generated between the rotator 10 and the magnetic-field generating unit 20 has a magnetic flux density distribution across the detector apparatus 110.

In this case, the magnetic flux density applied to the first magnetic resistor element 212 is also lower than the magnetic flux density applied to the third magnetic resistor element 214. Accordingly, the first offset voltage $V_{OS1}$ further shifts in the positive direction. FIG. 10 shows an exemplary case where, when the distance between the rotator 10 and the detector apparatus 110 is 0.45 mm, the first offset voltage $V_{OS1}$ has shifted to approximately 0 mV.

Likewise, the magnetic flux density applied to the fourth magnetic resistor element 314 is lower than the magnetic flux density applied to the second magnetic resistor element 312. Accordingly, the second offset voltage $V_{OS2}$ further shifts in the negative direction. FIG. 10 shows an exemplary case where, when the distance between the rotator 10 and the detector apparatus 110 is 0.45 mm, the second offset voltage $V_{OS2}$ has shifted to approximately 0 mV.

As described above, the detector apparatus 110 relating to the present embodiment generates in advance the initial offset voltages that have a larger absolute value than the offset voltages to be generated when the magnetic-field generating unit 20 applies magnetic field. In this manner, when the detector apparatus 110 is positioned in the vicinity of the rotator 10 so as to detect the magnetic field generated between the magnetic-field generating unit 20 and the rotator 10, that is, when the ratio of the magnetic flux density applied to the third magnetic resistor element 214 to the magnetic flux density applied to the first magnetic resistor element 212 increases and the ratio of the magnetic flux density applied to the second magnetic resistor element 312 to the magnetic flux density applied to the fourth magnetic resistor element 314 increases, the first offset voltage $V_{OS1}$ and the second offset voltage $V_{OS2}$ can change toward 0 V, when compared with the offset voltages generated at zero magnetic field. In other words, the detector apparatus 110 is configured such that the application of the magnetic field by the magnetic-field generating unit 20 changes the initial offset voltages in such a manner that their absolute values further decrease.

In other words, since the resistances of the magnetic resistor elements of the detector apparatus 110 are adjusted, the detector system 100 relating to the present embodiment can reduce or prevent the offset voltages generated in the detection signals. As a result, the detector system 100 relating to the present embodiment can accurately detect the rotation of the rotator 10. It has been shown that the detector system 100 can reduce the offset voltages to approximately 0 V by, for example, providing a distance of 0.45 mm between the rotator 10 and the detector apparatus 110. Alternatively, the various parameters may be adjusted in such a manner that offset voltages of approximately 0 V may be achieved when the distance between the rotator 10 and the detector apparatus 110 takes any different value.

In the above-described detector apparatus 110 relating to the present embodiment, the magnetic resistor elements are formed to originally have predetermined resistances to generate the initial offset voltages. Additionally, the resistances of the magnetic resistor elements may be adjusted in the detector apparatus 110 by switching the electrical connections and the like between the magnetic resistor elements after they are formed. To be specific, at least one of the first magnetic resistor element 212, the second magnetic resistor element 312, the third magnetic resistor element 214 and the fourth magnetic resistor element 314 may have a variable magnetic resistance for the same magnetic field.

In this manner, after manufactured, the detector apparatus 110 can still finely adjust the initial offset voltages. In addition, after the detector system 100 is assembled and the reduction in the offset voltages is actually confirmed, the detector apparatus 110 can still adjust the offset voltages.

The detector system 100 may include a plurality of detector apparatuses 110, each of which is directed to the above-described embodiment. For example, the detector system 100 may include two detector apparatuses 110, in which the first potential and the second potential are applied in reversed ways. With such configurations, the detector system 100 can output a differential signal. The following describes these two detector apparatuses 110.

Figure 11:
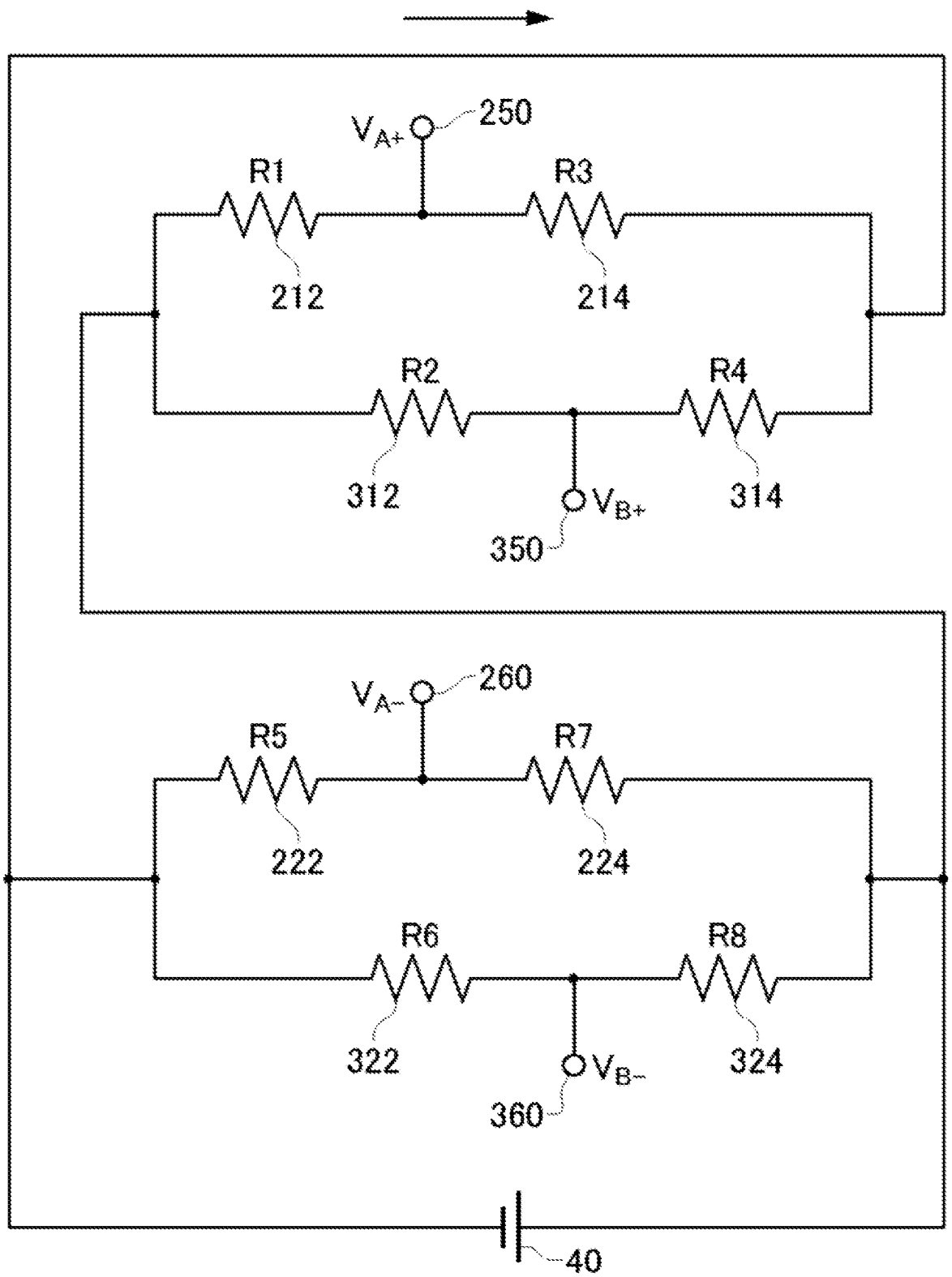
FIG. 11 shows a modification example of the detector apparatus 110 in accordance with the embodiment of the present invention.

FIG. 11 shows a modification example of the detector apparatus 110 in accordance with the embodiment of the present invention. FIG. 11 shows an exemplary case where two detector apparatuses 110, each of which is as shown in FIG. 9, are arranged in parallel in the direction orthogonal to the moving direction of the rotator 10. To be specific, the detector apparatus 110 shown in FIG. 11 includes, in addition to the first magnetic resistor element 212, the second magnetic resistor element 312, the third magnetic resistor element 214 and the fourth magnetic resistor element 314, a fifth magnetic resistor element 222, a sixth magnetic resistor element 322, a seventh magnetic resistor element 224 and an eighth magnetic resistor element 324.

The first magnetic resistor element 212 and the fifth magnetic resistor element 222 may have substantially the same resistance for the same magnetic field and may be formed next to each other in the moving direction of the rotator 10 in such a manner that there is complete overlap in the Y direction between the areas in which their magnetosensitive regions are provided. Referring to the pair of the second magnetic resistor element 312 and the sixth magnetic resistor element 322, the pair of the third magnetic resistor element 214 and the seventh magnetic resistor element 224, and the pair of the fourth magnetic resistor element 314 and the eighth magnetic resistor element 324, the magnetic resistor elements may also have substantially the same resistance for the same magnetic field and may be formed in such a manner that there is complete overlap in the Y direction between the areas in which their magnetosensitive regions are provided.

Furthermore, a third terminal 260 configured to output a third signal is provided between the fifth magnetic resistor element 222 and the seventh magnetic resistor element 224, and a fourth terminal 360 configured to output a fourth signal is provided between the sixth magnetic resistor element 322 and the eighth magnetic resistor element 324. The seventh magnetic resistor element 224 is provided between the first potential and the third terminal 260, and the eighth magnetic resistor element 324 is provided between the first potential and the fourth terminal 360. Likewise, the fifth magnetic resistor element 222 is provided between the second potential and the third terminal 260, and the sixth magnetic resistor element 322 is provided between the second potential and the fourth terminal 360.

With such configurations, the third terminal 260 can output the third signal in opposite phase to the first signal output from the first terminal 250. Likewise, the fourth terminal 360 can output the fourth signal in opposite phase to the second signal output from the second terminal 350. As described above, when the detector system 100 is configured using the detector apparatuses 110 relating to the present modification example, the detection signal output from the detector system 100 can be a differential signal.

Figure 12:
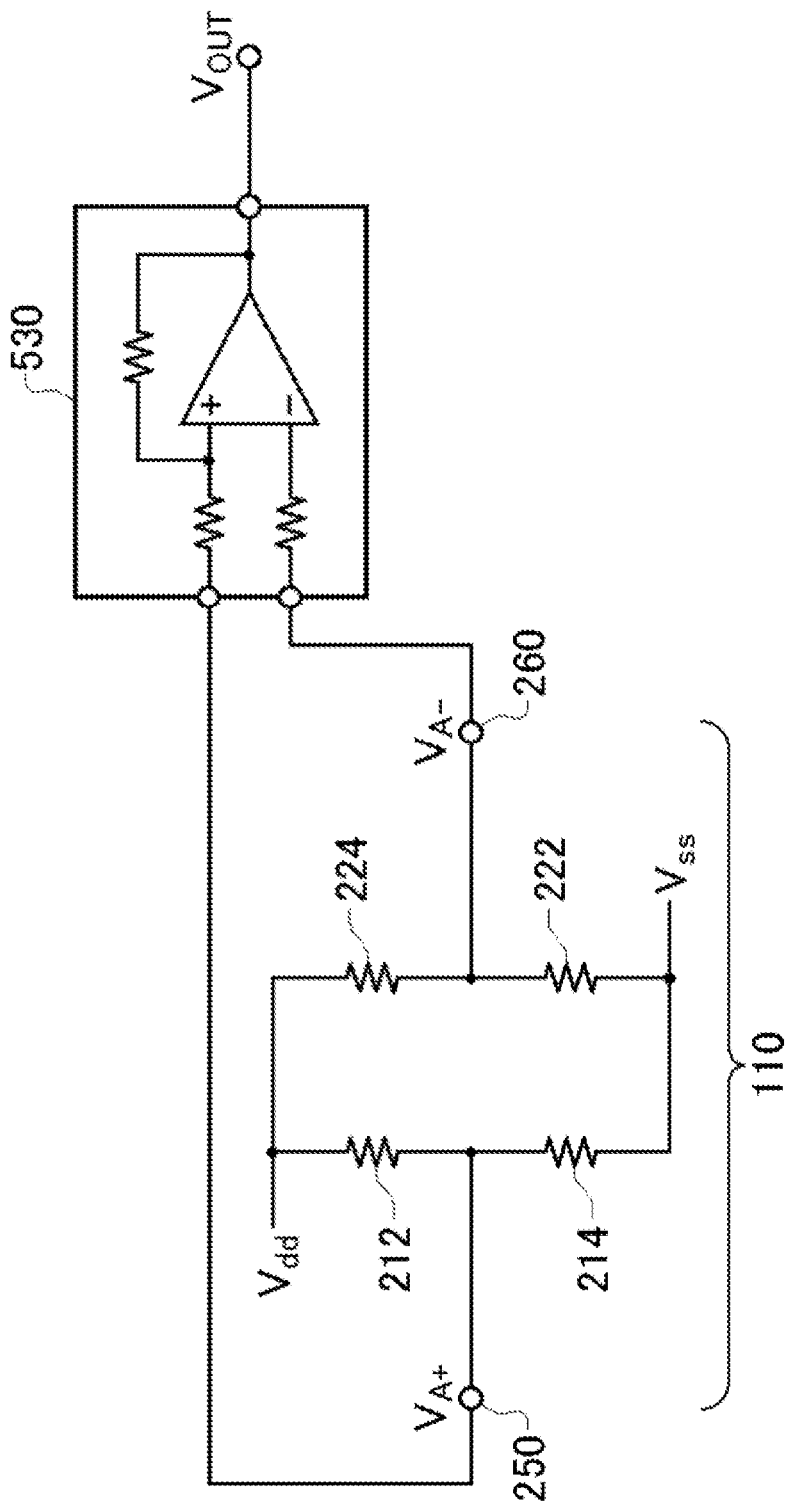
FIG. 12 shows, as an example, an amplifier circuit 530 corresponding to the detector apparatus 110 of the modification example shown in FIG. 11.

FIG. 12 shows, as an example, an amplifier circuit 530 corresponding to the detector apparatus 110 of the modification example shown in FIG. 11. FIG. 12 shows, as an example, the amplifier circuit 530 that is configured to receive the differential signal output from the first terminal 250 and the third terminal 260. The detector system 100 may include this amplifier circuit 530. FIG. 12 shows an exemplary case where the amplifier circuit 530 may convert the received differential signal into a single-ended signal.

In other words, the amplifier circuit 530 is a two-input one-output amplifier circuit and includes an operational amplifier and the like, for example. The amplifier circuit 530 receives at one input terminal thereof a positive detection signal $V_{A+}$ from the first terminal 250 and receives at the other input terminal thereof a negative detection signal $V_{A-}$ from the second terminal 350. The amplifier circuit 530 can reduce the common mode noise superimposed in the detection signal $V_{A+}$ and the detection signal $V_{A-}$, while amplifying the signal components having 180-degree different phases.

Likewise, the detector system 100 may further include an amplifier circuit configured to convert, into an single-ended output, the differential signal output from the pair of the second terminal 350 and the fourth terminal 360 in the detector apparatus 110 relating to the modification example. In other words, the detector system 100 can include two amplifier circuits that respectively correspond to the two differential signals output from the detector apparatus 110 relating to the modification example, thereby amplifying the signal strength of the two detection signals and reducing the common mode noise. With such configurations, the detector system 100 can detect the rotation of the rotator 10 more accurately.

Figure 13:
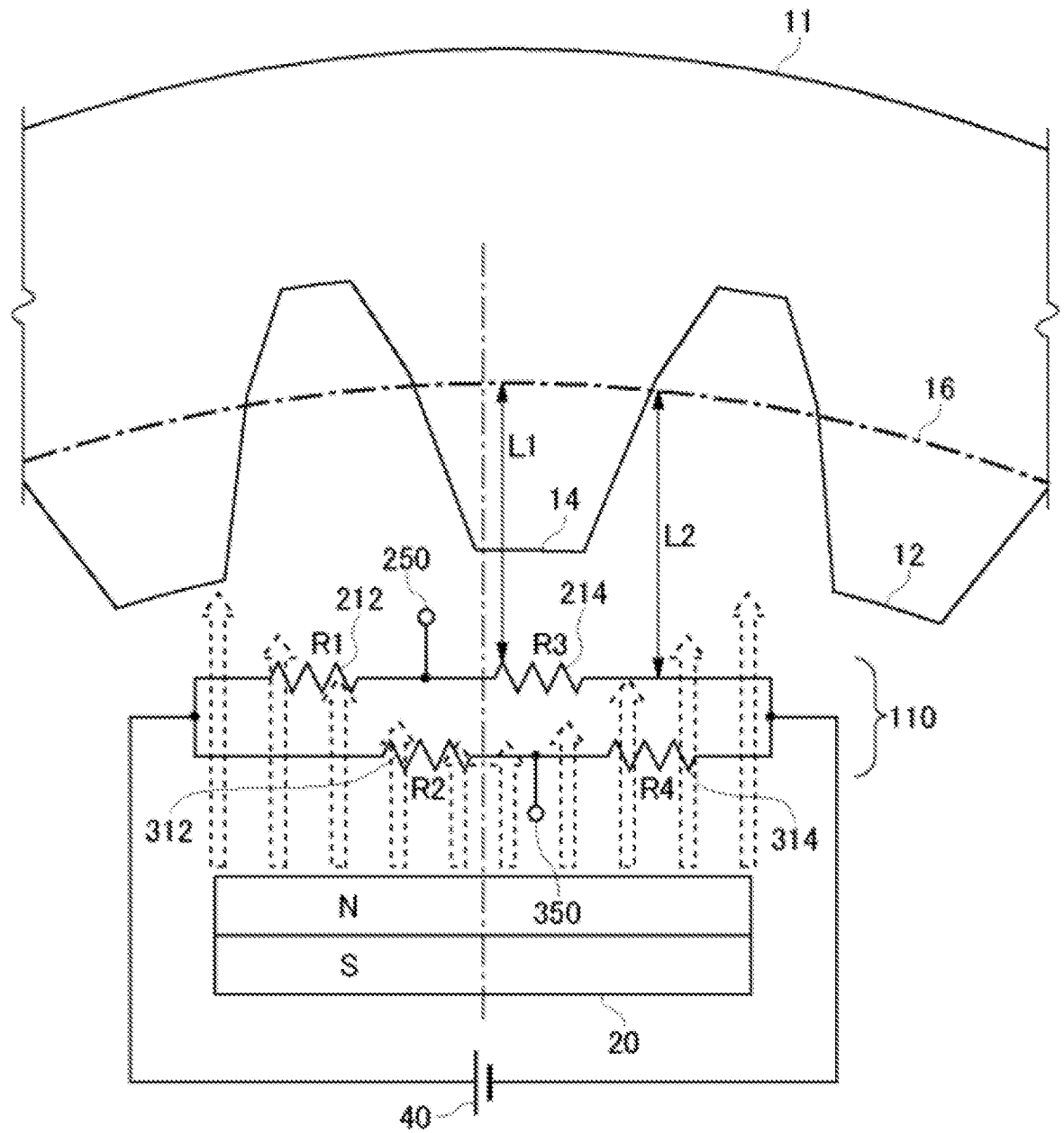
FIG. 13 shows an exemplary configuration of a size-reduced detector system 100 in accordance with a second embodiment.

FIG. 13 shows an exemplary configuration of a size-reduced detector system 100 in accordance with a second embodiment. The detector system 100 relating to the second embodiment uses a rotator 11 as the to-be-detected unit, in place of the rotator 10, which is used as the to-be-detected unit in the detector system 100 relating to the embodiment described with reference to FIGS. 1 to 10. Referring to the detector system 100 shown in FIG. 13, the constituents that operate in substantially the same manner as the corresponding constituents of the detector system 100 shown in FIG. 7 are assigned with the identical reference numerals and not redundantly described here except for the differences.

The detector system 100 relating to the second embodiment includes the rotator 11, the magnetic-field generating unit 20 and the detector apparatus 110. The rotator 11 is a gear having, on the inner circumference of the disk, protrusions and depressions that are alternately arranged in the moving direction of the rotation.

When the magnetic-field generating unit 20 is a permanent magnet shaped like a cuboid and the to-be-detected unit is the small-sized rotator 10 having the teeth facing outwardly as shown in FIG. 7, for example, the magnetic-field generating unit 20 tends to apply to the detector apparatus 110 such magnetic field that the highest magnetic flux density is generated from the central portion of the rectangular surface that faces the rotator 10 and the magnetic flux density decreases toward the peripheral portion. In the following description, this tendency may be referred to as the first tendency.

On the other hand, when the magnetic-field generating unit 20 is a permanent magnet shaped like a cuboid and the to-be-detected unit is the rotator 11 relating to the second embodiment, or the gear having the teeth facing inward, for example, the magnetic-field generating unit 20 tends to apply to the detector apparatus 110 such magnetic field that the magnetic flux density is substantially uniform across the entire rectangular surface facing the rotator 11 since the above-mentioned first tendency is cancelled due to the fact that the distance between the gear and the peripheral portion of the magnetic-field generating unit 20 is smaller than the distance between the gear and the central portion of the magnetic-field generating unit 20. Furthermore, when a size-reduced gear, for example, the rotator 11 is employed, the first tendency of the magnetic-field generating unit 20 is cancelled and the opposite tendency may start to be observed. To be specific, the magnetic-field generating unit 20 may tend to apply to the detector apparatus 110 such magnetic field that the highest magnetic flux density is generated by the peripheral portion of the rectangular surface that faces the rotator 11 and the magnetic flux density decreases toward the central portion. In the following description, this tendency may be referred to as the second tendency.

The second tendency is described in more details. If the size of the rotator 11 is reduced, the curvature of the rotator 11 increases. This means that the average distances between the rotator 11 and the respective magnetic resistor elements in the detector apparatus 110 tend to be significantly different from each other. In FIG. 13, the dotted line indicates a reference pitch circle 16 of the rotator 11. Regarding the distance between the detector apparatus 110 and the reference pitch circle 16, a distance L2 at the location distant from the location of the center is smaller than a distance L1 at the location near the location of the center, for example. Accordingly, the magnetic flux density of the magnetic field from the magnetic-field generating unit 20 to the rotator 11 increases as the location is moved away from the location of the center under the assumption that the rotator 11 has no protrusions or depressions. Such a location-dependent distribution of the magnetic flux density increases as the curvature of the rotator 11 increases or as the distance between the magnetic-field generating unit 20 and the rotator 11 decreases. FIG. 13 shows an exemplary case where the magnetic field generated by the magnetic-field generating unit 20 has a magnetic flux density distribution in the moving direction of the rotator 11.

The detector apparatus 110 includes the first magnetic resistor element 212 and the third magnetic resistor element 214 constituting the first magnetosensitive unit 210, the first terminal 250, the second magnetic resistor element 312 and the fourth magnetic resistor element 314 constituting the second magnetosensitive unit 310, and the second terminal 350. Here, it is desirable that the central portion of the detector apparatus 110 is substantially aligned with the central portion of the magnetic-field generating unit 20 in the moving direction of the rotator 11. FIG. 13 shows an exemplary case where the center of the detector apparatus 110 is substantially aligned with the center of the magnetic-field generating unit 20 at the position indicated by the alternate long and short dash line. In this case, in the moving direction of the rotator 11, the distance from the location of the center to the third magnetic resistor element 214 is shorter than the distance from the location of the center to the first magnetic resistor element 212. Accordingly, the voltage output from the first terminal 250 is equal to the result of adding the offset voltage to the midpoint voltage between the first potential and the second potential.

Likewise, in the moving direction of the rotator 11, the distance from the location of the center to the second magnetic resistor element 312 is shorter than the distance from the location of the center to the fourth magnetic resistor element 314. Accordingly, the voltage output from the second terminal 350 is equal to the result of adding the offset voltage to the midpoint voltage between the first potential and the second potential. Here, the offset voltages included in the potentials respectively output from the first terminal 250 and the second terminal 350 have substantially the same absolute value and different ones of the positive and negative signs. For example, a positive offset is superimposed in the detection signal $V_A$ from the first terminal 250 shown in FIG. 5, and a negative offset is superimposed in the detection signal $V_B$ from the second terminal 350.

Figure 14:
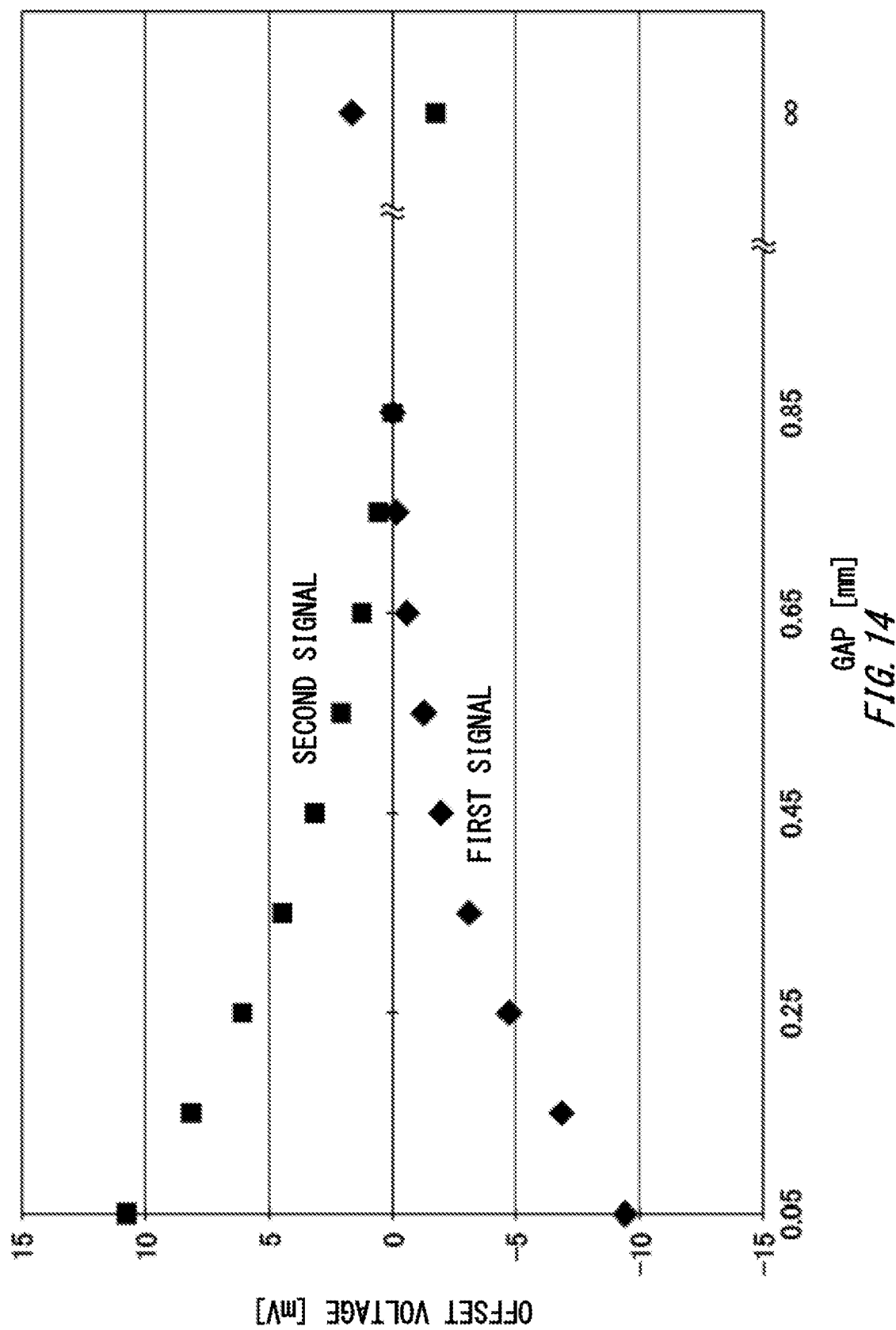
FIG. 14 shows, as an example, offset voltages for a first signal and a second signal output from a detector apparatus 110 in accordance with the second embodiment.

FIG. 14 shows, as an example, the offset voltage for the first signal and the second signal output from the detector apparatus 110 in accordance with the second embodiment. FIG. 14 shows, as an example, the results of simulations performed under such conditions that the gear has 36 teeth, has a module of 0.4, and is made of S45C, and the magnet is made of SmCo. In FIG. 14, the horizontal axis represents the distance between the rotator 11 and the detector apparatus 110, which is referred to as the gap. This distance may be, for example, an average distance between the rotator 11 and the detector apparatus 110, or the distance between the reference pitch circle 16 of the rotator 11 and a representative point on the detector apparatus 110, for example, the central point of the detector apparatus 110. In FIG. 14, the vertical axis represents the offset voltage. Note that the initial conditions for the simulations shown in FIG. 14 include such conditions that the initial value of the offset voltages is 0 V in the zero-magnetic-field environment in which the detector apparatus 110 is spaced away from the magnetic-field generating unit 20 and the rotator 11 and the magnetic-field generating unit 20 is not provided.

FIG. 14 shows an exemplary case where the offset voltages are generated since the magnetic-field generating unit 20 is placed in the vicinity of the detector apparatus 110 with the detector apparatus 110 being kept spaced away from the rotator 11. The offset voltages generated under these conditions correspond to the offset voltages observed when the gap, represented by the horizontal axis, is ∞. Here, in the first signal, a positive offset voltage is generated due to the above-described first tendency when the gap is large, and a negative offset voltage is generated due to the above-described second tendency when the gap is small. In the second signal, a negative offset voltage is generated due to the above-described first tendency when the gap is large and a positive offset voltage is generated due to the above-described second tendency when the gap is small.

When the gap between the rotator 11 and the detector apparatus 110 is ∞, the magnetic-field generating unit 20 exhibits the first tendency, according to which the magnetic-field generating unit 20 applies to the detector apparatus 110 such magnetic field that the highest magnetic flux density is generated from the central portion of the rectangular surface that faces the rotator 11 and the magnetic flux density decreases toward the peripheral portion. As the distance between the detector apparatus 110 and the rotator 11 decreases, however, the absolute values of the offset voltages decrease.

As the distance further decreases, the polarities are reversed and the absolute values start to increase. If the generated offset voltages exceed several dozen mV, the detector apparatus 110 may make errors in detecting the rotation. In addition, such offset voltages may result in deterioration of the dynamic range, the S/N and the like. Therefore, the detector apparatus 110 relating to the second embodiment is configured to reduce or prevent the generation of such offset voltages.

Figure 15:
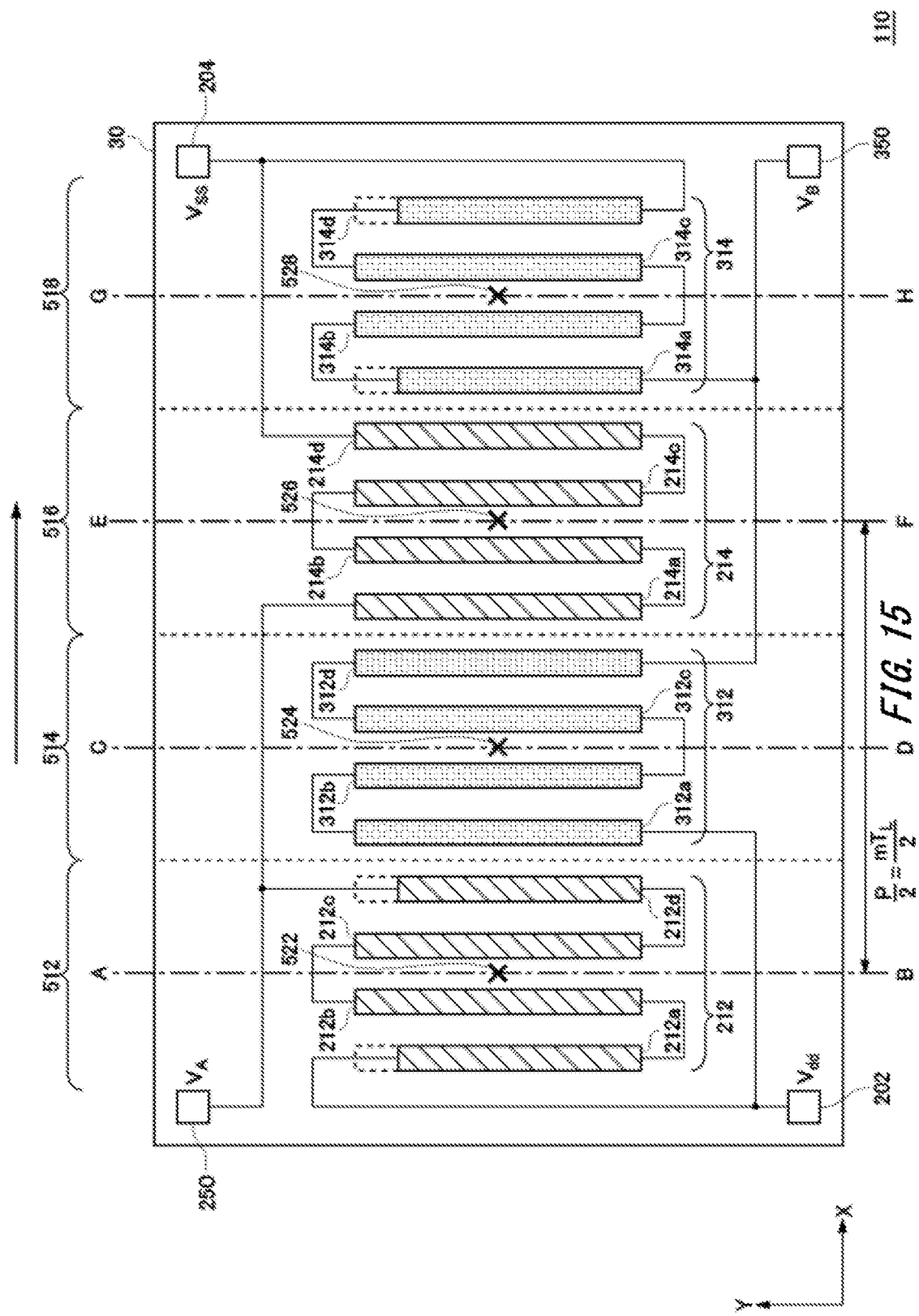
FIG. 15 shows an exemplary configuration of the detector apparatus 110 in accordance with the second embodiment.

FIG. 15 shows an exemplary configuration of the detector apparatus 110 in accordance with the second embodiment. Referring to the detector apparatus 110 shown in FIG. 15, the constituents that operate in substantially the same manner as the corresponding constituents of the detector apparatus 110 shown in FIGS. 6 and 9 are assigned with the identical reference numerals and not described here.

In the detector apparatus 110 relating to the second embodiment, as for the resistances for the same magnetic field, the relation of whether or not the resistance of the third magnetic resistor element 214 in the detector apparatus 110 is higher than the resistance of the first magnetic resistor element 212, and the relation of whether or not the resistance of the second magnetic resistor element 312 is higher than the resistance of the fourth magnetic resistor element 314 are reversed when compared with the embodiment described with reference to FIGS. 1 to 10. To be more specific, in the embodiment described with reference to FIGS. 1 to 10, the third magnetic resistor element 214 has a lower resistance for the same magnetic field than the first magnetic resistor element 212, and the second magnetic resistor element 312 has a lower resistance for the same magnetic field than the fourth magnetic resistor element 314. In the second embodiment, on the contrary, the third magnetic resistor element 214 has a higher resistance for the same magnetic field than the first magnetic resistor element 212, and the second magnetic resistor element 312 has a higher resistance for the same magnetic field than the fourth magnetic resistor element 314. To be more specific, in the detector apparatus 110 relating to the second embodiment, in terms of the moving direction of the rotator 11, the magnetic resistor element that is positioned distant from the central axis of the detector apparatus 110 has a lower resistance for the same magnetic field than the magnetic resistor element that is positioned close to the central axis.

In other words, the first magnetic resistor element 212 is formed to originally have a lower resistance for the same magnetic field than the third magnetic resistor element 214, and the fourth magnetic resistor element 314 is formed to originally have a lower resistance for the same magnetic field than the second magnetic resistor element 312. In this case, the third magnetic resistor element 214 may have a different shape than the first magnetic resistor element 212, and the second magnetic resistor element 312 may have a different shape than the fourth magnetic resistor element 314. Alternatively, the respective magnetic resistor elements may have different thicknesses and/or may be made of different materials.

Figure 16:
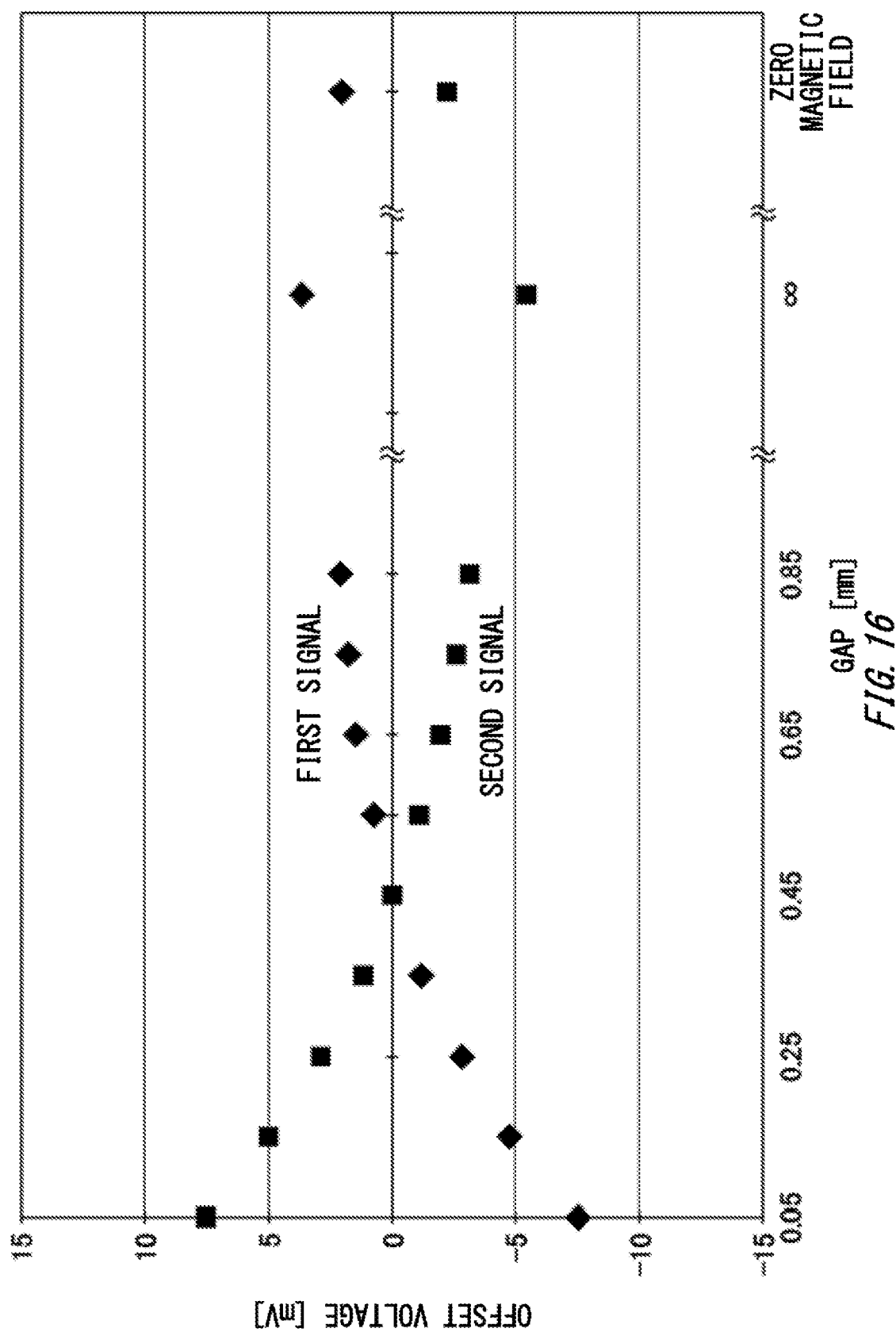
FIG. 16 shows, as an example, the offset voltages for the first signal and the second signal output from the detector apparatus 110 in accordance with the second embodiment.

For example, the first magnetic resistor element 212 has such a shape that at least a portion of the first magnetic resistor element 212 is shorter than the third magnetic resistor element 214 in the direction orthogonal to the moving direction of the rotator 11. FIG. 16 shows an exemplary case where the first magnetic resistor element 212 includes four magnetosensitive regions, i.e., a magnetosensitive region 212a, a magnetosensitive region 212b, a magnetosensitive region 212c and a magnetosensitive region 212d, and the magnetosensitive region 212a and the magnetosensitive region 212d are shorter in the Y direction. With such configurations, the resistance of the first magnetic resistor element 212 can be lowered by rarely changing the location 522 of the center of the magnetosensitive surface in the moving direction of the rotator 11. Here, it may be allowed to move the location 522 of the center of the magnetosensitive surface, for example, on the center line AB of the first region 512, which corresponds to the Y direction.

Likewise, the fourth magnetic resistor element 314 has such a shape that at least a portion of the fourth magnetic resistor element 314 is shorter than the second magnetic resistor element 312 in the direction orthogonal to the moving direction of the rotator 11. FIG. 15 shows an exemplary case where the fourth magnetic resistor element 314 includes four magnetosensitive regions, i.e., a magnetosensitive region 314a, a magnetosensitive region 314b, a magnetosensitive region 314c and a magnetosensitive region 314d, and the magnetosensitive region 314a and the magnetosensitive region 314d are shorter in the Y direction. With such configurations, the resistance of the fourth magnetic resistor element 314 can be lowered by rarely changing the location 528 of the center of the magnetosensitive surface in the moving direction of the rotator 11. Here, it may be allowed to move the location 528 of the center of the magnetosensitive surface, for example, on the center line GH of the fourth region 518, which corresponds to the Y direction.

In the above-described manner, in the detector apparatus 110 relating to the second embodiment, while the resistances of the magnetic resistor elements are adjusted, the magnetic resistor elements can be arranged on the substrate 30 next to each other in the moving direction of the rotator 11 in such a manner that the centers of their magnetosensitive surfaces are positioned at equal intervals. Note that the manner of adjusting the resistances of the first magnetic resistor element 212 and the fourth magnetic resistor element 314 is not limited to the exemplary configuration shown in FIG. 15. Any alternative manners can be employed as long as the centers of the magnetosensitive surfaces are not changed in the moving direction of the rotator 11. For example, all of the four magnetosensitive surfaces may be reduced in length. As another alternative example, the magnetosensitive regions close to the central axis in each region (for example, the magnetosensitive region 314b and the magnetosensitive region 314c) may be reduced in length.

In order to form the above-described magnetosensitive regions, magnetosensitive regions that have predetermined different lengths may be formed on the substrate 30. Alternatively, magnetosensitive regions that have predetermined substantially the same length are first formed on the substrate 30 and then the formed magnetosensitive regions may be at least partially trimmed to finely adjust their lengths.

FIG. 16 shows, as an example, the offset voltages for the first signal and the second signal output from the detector apparatus 110 in accordance with the second embodiment. As in FIG. 14, FIG. 16 shows, as an example, the results of simulations performed under such conditions that the gear has 36 teeth, has a module of 0.4, and is made of S45C, and the magnet is made of SmCo. In FIG. 16, the horizontal axis represents the distance between the magnetic-field generating unit 20 and the rotator 11. In FIG. 16, the vertical axis represents the offset voltage.

Note that, in FIG. 16, the term "ZERO MAGNETIC FIELD" marked along the horizontal axis indicates the offset voltages that are output in the zero-magnetic-field environment in which the detector apparatus 110 is spaced away from the magnetic-field generating unit 20 and the rotor 11, as in FIG. 10. Here, $R_1$, $R_2$, $R_3$ and $R_4$ respectively denote the resistances of the first magnetic resistor element 212, the second magnetic resistor element 312, the third magnetic resistor element 214, and the fourth magnetic resistor element 314 that are observed in the zero-magnetic-field environment in which no magnetic field is applied to the detector apparatus 110.

In the detector apparatus 110 relating to the second embodiment, the respective magnetic resistor elements are formed to originally satisfy the conditions of $R_1 < R_3$ and $R_2 > R_4$. In this manner, the voltage $V_A$ of the first terminal 250 and the voltage $V_B$ of the second terminal 350 at the zero magnetic field are different from the midpoint voltage between the first potential $V_{dd}$ and the second potential $V_{ss}$ as indicated by the following equation.

$$V_A = (V_{dd} - V_{ss}) \cdot R_3/(R_1+R_3) > (V_{dd} - V_{ss})/2$$

$$V_B = (V_{dd} - V_{ss}) \cdot R_4/(R_2+R_4) < (V_{dd} - V_{ss})/2 \quad \text{Equation 3}$$

The second magnetic resistor element 214 and the third magnetic resistor element 312 may be formed to originally exhibit equal resistances for the same magnetic field. Likewise, the first magnetic resistor element 212 and the fourth magnetic resistor element 314 may be formed to originally exhibit equal resistances for the same magnetic field. In other words, the respective magnetic resistor elements of the detector apparatus 110 may be formed to originally satisfy the conditions of $R_1 = R_4$ and $R_2 = R_3$. In this case, a first offset voltage $V_{OS1}$ for the first terminal 250 and a second offset voltage $V_{OS2}$ for the second terminal 350 are calculated as indicated by the following equations, and have different signs but equal absolute values. Here, $V_M$ denotes the midpoint voltage between the first potential $V_{dd}$ and the second potential $V_{ss}$.

$$V_{OS1} = V_A - V_M = V_M(R_3 - R_1)/(R_1+R_3) > 0$$

$$V_{OS2} = V_B - V_M = V_M(R_4 - R_2)/(R_2+R_4) = -V_{OS1} < 0$$

$$V_M = (V_{dd} - V_{ss})/2 \quad \text{Equation 4}$$

As described above, in the zero-magnetic-field environment in which no magnetic field is applied to the detector apparatus 110, the voltage of the first terminal 250 between the first magnetic resistor element 212 and the third magnetic resistor element 214 is different from the midpoint voltage between the first potential and the second potential by the first offset voltage $V_{OS1}$. Considering the relation of $R_1 < R_3$, the first offset voltage $V_{OS1}$ is a positive potential.

Likewise, the voltage of the second terminal 350 between the second magnetic resistor element 312 and the fourth magnetic resistor element 314 is different from the midpoint voltage between the first potential and the second potential by the second offset voltage $V_{OS2}$. Considering the relation of $R_4 < R_2$, the second offset voltage $V_{OS2}$ is a negative potential.

In FIG. 16, the mark "∞" marked along the horizontal axis indicates the offset voltages that are output in the environment in which the magnetic-field generating unit 20 is positioned in the vicinity of the detector apparatus 110 while the detector apparatus 110 remains spaced away from the rotator 10, as in FIG. 10. As described above with reference to FIGS. 13 and 14, when the gap between the rotator 11 and the detector apparatus 110 is ∞, the magnetic-field generating unit 20 exhibits the first tendency, according to which the magnetic-field generating unit 20 applies to the detector apparatus 110 such magnetic field that the highest magnetic flux density is generated from the central portion of the rectangular surface of the magnetic-field generating unit 20 that faces the rotor 11 and the magnetic flux density decreases toward the peripheral portion. As the gap between the rotor 11 and the detector apparatus 110 decreases, however, the magnetic-field generating unit 20 switches to the second tendency, according to which the magnetic-field generating unit 20 applies to the detector apparatus 110 such magnetic field that the highest magnetic flux density is generated from the peripheral portion of the rectangular surface of the magnetic-field generating unit 20 and the magnetic flux density decreases toward the central portion.

In other words, when the gap between the rotor 11 and the detector apparatus 110 is ∞, the magnetic flux density applied to the first magnetic resistor element 212 is lower than the magnetic flux density applied to the third magnetic resistor element 214. Here, since the third magnetic resistor element 214 is formed to originally exhibit a higher resistance for the same magnetic field than the first magnetic resistor element 212 and the increase in resistance caused by the magnetic-field generating unit 20 is larger in the third magnetic resistor element 214 than in the first magnetic resistor element 212, a temporary shift is caused in the positive direction in the first offset voltage $V_{OS1}$ when compared with the zero-magnetic-field environment. As the gap between the rotor 11 and the detector apparatus 110 decreases, however, the magnetic flux density applied to the first magnetic resistor element 212 increases to be higher than the magnetic flux density applied to the third magnetic resistor element 214. As a result, the increase in the resistance that is caused by the magnetic-field generating unit 20 is smaller in the third magnetic resistor element 214 than in the first magnetic resistor element 212. This causes a shift in the negative direction in the first offset voltage $V_{OS1}$.

When the gap between the rotor 11 and the detector apparatus 110 is ∞, the magnetic flux density applied to the fourth magnetic resistor element 314 is lower than the magnetic flux density applied to the second magnetic resistor element 312. Here, since the second magnetic resistor element 312 is formed to originally exhibit a higher resistance for the same magnetic field than the fourth magnetic resistor element 314 and the increase in resistance caused by the magnetic-field generating unit 20 is larger in the second magnetic resistor element 312 than in the fourth magnetic resistor element 314, a temporary shift is caused in the negative direction in the second offset voltage $V_{OS2}$ when compared with the zero-magnetic-field environment. As the gap between the rotor 11 and the detector apparatus 110 decreases, however, the magnetic flux density applied to the fourth magnetic resistor element 314 increases to be higher than the magnetic flux density applied to the second magnetic resistor element 312. As a result, the increase in the resistance that is caused by the magnetic-field generating unit 20 is smaller in the second magnetic resistor element 312 than in the fourth magnetic resistor element 314. This causes a shift in the positive direction in the second offset voltage $V_{OS2}$.

As described above, the detector apparatus 110 relating to the second embodiment generates in advance the initial offset voltages at the zero magnetic field. In this manner, the application of the magnetic field by the magnetic-field generating unit 20 causes a temporary change away from 0 V in the first offset voltage $V_{OS1}$ and the second offset voltage $V_{OS2}$ while the rotor 11 is distant, but can eventually cause a change toward 0 V as a result of the decrease in the gap between the rotator 11 and the detector apparatus 110. In other words, the detector apparatus 110 is configured such that the application of the magnetic field by the magnetic-field generating unit 20 and the decrease in the distance between the detector apparatus 110 and the rotator 11 change the initial offset voltages in such a manner that their absolute values decrease.

FIG. 16 plots the offset voltages observed when the rotator 11 and the magnetic-field generating unit 20 are positioned in the vicinity of the detector apparatus 110 to constitute the detector system 100, which are associated with the numbers "0.05" to "0.85" marked along the horizontal axis. As described with reference to FIGS. 13 and 14, as a result of an increase in the curvature of the rotator 11, the magnetic field generated between the rotator 11 and the magnetic-field generating unit 20 has a magnetic flux density distribution across the detector apparatus 110.

In this case, the magnetic flux density applied to the first magnetic resistor element 212 is higher than the magnetic flux density applied to the third magnetic resistor element 214. Accordingly, the first offset voltage $V_{OS1}$ shifts in the negative direction. FIG. 16 shows an exemplary case where, when the distance between the rotator 11 and the detector apparatus 110 is 0.45 mm, the first offset voltage $V_{OS1}$ has shifted to approximately 0 mV.

Likewise, the magnetic flux density applied to the fourth magnetic resistor element 314 is higher than the magnetic flux density applied to the second magnetic resistor element 312. Accordingly, the second offset voltage $V_{OS2}$ shifts in the positive direction. FIG. 16 shows an exemplary case where, when the distance between the rotator 11 and the detector apparatus 110 is 0.45 mm, the second offset voltage $V_{OS2}$ has shifted to approximately 0 mV.

As described above, the detector apparatus 110 relating to the second embodiment generates in advance the initial offset voltages. In this manner, when the detector apparatus 110 is positioned in the vicinity of the rotator 11 and detects the magnetic field generated between the magnetic-field generating unit 20 and the rotator 11, that is, when the ratio of the magnetic flux density applied to the third magnetic resistor element 214 to the magnetic flux density applied to the first magnetic resistor element 212 decreases and the ratio of the magnetic flux density applied to the second magnetic resistor element 312 to the magnetic flux density applied to the fourth magnetic resistor element 314 decreases, the first offset voltage $V_{OS1}$ and the second offset voltage $V_{OS2}$ can change toward 0 V, when compared with the offset voltages generated at zero magnetic field.

In other words, since the resistances of the magnetic resistor elements of the detector apparatus 110 are adjusted, the detector system 100 relating to the second embodiment can reduce or prevent the offset voltages generated in the detection signals. As a result, the detector system 100 relating to the second embodiment can accurately detect the rotation of the rotator 11. It has been shown that the detector system 100 can reduce the offset voltages to approximately 0 V by, for example, providing a distance of 0.45 mm between the rotator 11 and the detector apparatus 110. Alternatively, the various parameters may be adjusted in such a manner that offset voltages of approximately 0 V may be achieved when the distance between the rotator 11 and the detector apparatus 110 takes any different value.

In the detector apparatuses 110 relating to the embodiments described above, as for the resistance for the same magnetic field, the relation of whether or not the resistance of the third magnetic resistor element 214 is higher than the resistance of the first magnetic resistor element 212 is the same as the relation of whether or not the resistance of the second magnetic resistor element 312 is higher than the resistance of the fourth magnetic resistor element 314.

According to the foregoing description of the first embodiment, the third magnetic resistor element 214 and the second magnetic resistor element 312 are shaped in such a manner that they are at least partially shorter in the direction orthogonal to the moving direction of the rotator 10 than the first magnetic resistor element 212 and the fourth magnetic resistor element 314 respectively, in order to satisfy such relations that the third magnetic resistor element 214 has a lower resistance for the same magnetic field than the first magnetic resistor element 212 and the second magnetic resistor element 312 has a lower resistance for the same magnetic field than the fourth magnetic resistor element 314. Alternatively or additionally, for example, the third magnetic resistor element 214 may be at least partially formed to have a larger thickness than the first magnetic resistor element 212. The third magnetic resistor element 214 may be configured by four magnetosensitive regions including the magnetosensitive region 214a, the magnetosensitive region 214b, the magnetosensitive region 214c, and the magnetosensitive region 214d and the magnetosensitive region 214a and the magnetosensitive region 214d may have a large thickness. With such configurations, the resistance of the third magnetic resistor element 214 can be lowered by rarely changing the location 526 of the center of the magnetosensitive surface in the moving direction of the rotator 10. Here, it may be allowed to move the location 526 of the center of the magnetosensitive surface, for example, on the center line EF of the third region 516, which corresponds to the Y direction.

Likewise, the second magnetic resistor element 312 may at least partially be formed to have a larger thickness than the fourth magnetic resistor element 314. The second magnetic resistor element 312 may be configured by four magnetosensitive regions including the magnetosensitive region 312a, the magnetosensitive region 312b, the magnetosensitive region 312c, and the magnetosensitive region 312d and the magnetosensitive region 312a and the magnetosensitive region 312d may have a large thickness. With such configurations, the resistance of the second magnetic resistor element 312 can be lowered by rarely changing the location 524 of the center of the magnetosensitive surface in the moving direction of the rotator 10. Here, it may be allowed to move the location 524 of the center of the magnetosensitive surface, for example, on the center line CD of the second region 514, which corresponds to the Y direction.

In the above-described manner, while the resistances of the magnetic resistor elements are adjusted, the magnetic resistor elements can be arranged on the substrate 30 next to each other in the moving direction of the rotator 10 in such a manner that the centers of their magnetosensitive surfaces are positioned at equal intervals. Note that the manner of adjusting the resistances of the second magnetic resistor element 312 and the third magnetic resistor element 214 is not limited to this exemplary configuration. Any alternative manners can be employed as long as the centers of the magnetosensitive surfaces are not changed in the moving direction of the rotator 10. For example, all of the four magnetosensitive surfaces may be increased in thickness. As another alternative example, the magnetosensitive regions close to the central axis in each region (for example, the magnetosensitive region 214b and the magnetosensitive region 214c) may be increased in thickness.

According to the foregoing description of the second embodiment, the first magnetic resistor element 212 and the fourth magnetic resistor element 314 are shaped in such a manner that they are at least partially shorter in the direction orthogonal to the moving direction of the rotator 11 than the third magnetic resistor element 214 and the second magnetic resistor element 312 respectively, in order to satisfy such relations that the first magnetic resistor element 212 has a lower resistance for the same magnetic field than the third magnetic resistor element 214 and the fourth magnetic resistor element 314 has a lower resistance for the same magnetic field than the second magnetic resistor element 312. Alternatively or additionally, for example, the first magnetic resistor element 212 may be at least partially formed to have a larger thickness than the third magnetic resistor element 214. The first magnetic resistor element 212 may be configured by four magnetosensitive regions including the magnetosensitive region 212a, the magnetosensitive region 212b, the magnetosensitive region 212c, and the magnetosensitive region 212d and the magnetosensitive region 212a and the magnetosensitive region 212d may have a large thickness. With such configurations, the resistance of the first magnetic resistor element 212 can be lowered by rarely changing the location 522 of the center of the magnetosensitive surface in the moving direction of the rotator 11. Here, it may be allowed to move the location 522 of the center of the magnetosensitive surface, for example, on the center line AB of the first region 512, which corresponds to the Y direction.

Likewise, the fourth magnetic resistor element 314 may at least partially be formed to have a larger thickness than the second magnetic resistor element 312. The fourth magnetic resistor element 314 may be configured by four magnetosensitive regions including the magnetosensitive region 314a, the magnetosensitive region 314b, the magnetosensitive region 314c, and the magnetosensitive region 314d and the magnetosensitive region 314a and the magnetosensitive region 314d may have a large thickness. With such configurations, the resistance of the fourth magnetic resistor element 314 can be lowered by rarely changing the location 528 of the center of the magnetosensitive surface in the moving direction of the rotator 11. Here, it may be allowed to move the location 528 of the center of the magnetosensitive surface, for example, on the center line GH of the fourth region 518, which corresponds to the Y direction.

In the above-described manner, while the resistances of the magnetic resistor elements are adjusted, the magnetic resistor elements can be arranged on the substrate 30 next to each other in the moving direction of the rotator 11 in such a manner that the centers of their magnetosensitive surfaces are positioned at equal intervals. Note that the manner of adjusting the resistances of the fourth magnetic resistor element 314 and the first magnetic resistor element 212 is not limited to this exemplary configuration. Any alternative manners can be employed as long as the centers of the magnetosensitive surfaces are not changed in the moving direction of the rotator 11. For example, all of the four magnetosensitive surfaces may be increased in thickness. As another alternative example, the magnetosensitive regions close to the central axis in each region (for example, the magnetosensitive region 212b and the magnetosensitive region 212c) may be increased in thickness.

In order to form the magnetosensitive regions having different thicknesses, magnetosensitive regions that have predetermined different thicknesses may be formed on the substrate 30. Alternatively, magnetosensitive regions that have predetermined substantially the same thickness are first formed on the substrate 30 and then the formed magnetosensitive regions may be at least partially trimmed to finely adjust their resistances.

In the detector apparatus 110 relating to the above-described embodiments, the manner of adjusting the initial offset voltages is not limited to the adjustment of the resistances of the magnetic resistor elements. For example, the detector apparatus 110 may adjust the initial offset voltages by connecting a resistor in series or parallel with the magnetic resistor elements. In this case, for example, the first magnetosensitive unit 210 may include the first magnetic resistor element 212 and the third magnetic resistor element 214, which are arranged next to each other in the moving direction of the rotator 10, and a first resistor that is electrically connected to the first magnetic resistor element 212. Likewise, the second magnetosensitive unit 310 may include the second magnetic resistor element 312 and the fourth magnetic resistor element 314, which are arranged next to each other in the moving direction of the rotator 10, and a second resistor that is electrically connected to the fourth magnetic resistor element 314.

The first resistor, the first magnetic resistor element 212 and the third magnetic resistor element 214 may be electrically connected in series between the first potential and the second potential, and the second magnetic resistor element 312, the fourth magnetic resistor element 314 and the second resistor may be electrically connected in series between the first potential and the second potential. Furthermore, as for the resistance for the same magnetic field, the relation of whether or not the resistance of the third magnetic resistor element 214 is higher than the combined resistance of the first resistor and the first magnetic resistor element 212 may be the same as the relation of whether or not the resistance of the second magnetic resistor element 312 is higher than the combined resistance of the second resistor and the fourth magnetic resistor element 314.

For example, the compound resistor of the first resistor and the first magnetic resistor element 212 is formed to originally have a higher resistance for the same magnetic field than the third magnetic resistor element 214, and the compound resistor of the second resistor and the fourth magnetic resistor element 314 is formed to originally have a higher resistance for the same magnetic field than the second magnetic resistor element 312. Alternatively, for example, the compound resistor of the first resistor and the first magnetic resistor element 212 is formed to originally have a lower resistance for the same magnetic field than the third magnetic resistor element 214, and the compound resistor of the second resistor and the fourth magnetic resistor element 314 is formed to originally have a lower resistance for the same magnetic field than the second magnetic resistor element 312.

The first magnetic resistor element 212 and the third magnetic resistor element 214 may be formed to originally have equal resistances for the same magnetic field. In this manner, the initial offset voltage that is generated in the voltage between the first magnetic resistor element 212 and the third magnetic resistor element 214 can be determined by the resistance of the first resistor. Likewise, the second magnetic resistor element 312 and the fourth magnetic resistor element 314 may be formed to originally have equal resistances for the same magnetic field. In this manner, the initial offset voltage that is generated in the voltage between the second magnetic resistor element 312 and the fourth magnetic resistor element 314 can be determined by the resistance of the second resistor.

The first magnetic resistor element 212, the second magnetic resistor element 312, the third magnetic resistor element 214 and the fourth magnetic resistor element 314 may be formed to originally have equal resistances for the same magnetic field. In this manner, the initial offset voltage that is generated in the voltage between the first magnetic resistor element 212 and the third magnetic resistor element 214 can be determined by the resistance of the first resistor, and the initial offset voltage that is generated in the voltage between the second magnetic resistor element 312 and the fourth magnetic resistor element 314 can be determined by the resistance of the second resistor. This means that the detector apparatus 110 can also generate the initial offset voltages without requiring the adjustment of the resistances of the magnetic resistor elements. Alternatively, the detector apparatus 110 may generate the initial offset voltages based on the combination of the adjustment of the resistances of the magnetic resistor elements and the adjustment achieved by adding the resistors.

In the foregoing description of the detector apparatuses 110 relating to the embodiments, the magnetosensitive regions formed on the substrate 30 are shaped as a rectangle extending perpendicularly to the moving direction of the rotators 10 and 11, but the present invention is not limited to such. The magnetosensitive regions may be shaped like a triangle, a square, a trapezoid, a polygonal, a circle, an ellipsoid or the like. The above describes an exemplary case where each magnetic resistor element includes four magnetosensitive regions, but the present invention is not limited to such. Each magnetic resistor element may include one or more magnetosensitive regions.

According to the above description, the detector systems 100 relating to the embodiments include, as the to-be-detected unit, a gear or the rotators 10 and 11, but the present invention is not limited to such. The rotators 10 and 11 are described as an exemplary to-be-detected unit, which is provided in the detector system 100 as the target to be detected. The to-be-detected unit may be any member that has depressions and/or protrusions facing the detector apparatus 110 and being alternately arranged along the moving direction, that allows the detector apparatus 110 to face the depressions and/or protrusions, and that can be configured to change the magnetic flux density applied to the magnetosensitive units.

The to-be-detected unit may be a spur gear, a helical gear, a double helical gear, a bevel gear, an internal gear, a crown gear, a screw gear, a worm gear, a sprocket, and a rack or pinion, and the like. Alternatively, the to-be-detected unit may simply be a member that is obtained by forming protrusions and/or depressions in a disk-like plate member. Alternatively, the to-be-detected unit may include a plate member in which a plurality of through holes are arranged so as to face the detector apparatus 110 along the direction in which the to-be-detected unit moves relative to the detector apparatus 110.

In the above-description of the embodiments, the to-be-detected unit rotates, but the present invention is not limited to such. When the to-be-detected unit is a rack or the like, the protrusions and/or depressions may move in a single direction. Furthermore, the to-be-detected unit may be stationary and the detector apparatus 110 may move. In this case, the detector apparatus 110 may be operated under the premise that the to-be-detected unit may move in relation to the detector apparatus 110. In other words, in the above-described embodiments, the rotators 10 and 11 are described as "moving," but the rotators 10 and 11 may be alternatively described as "moving relatively."

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCE NUMERALS 10, 11: rotator, 12: first tooth, 14: second tooth, 16: pitch circle, 20: magnetic-field generating unit, 30: substrate, 40: power source, 100: detector system, 110: detector apparatus, 202: first potential terminal, 204: second potential terminal, 210: first magnetosensitive unit, 212: first magnetic resistor element, 214: third magnetic resistor element, 214a: magnetosensitive region, 214b: magnetosensitive region, 214c: magnetosensitive region, 214d: magnetosensitive region, 222: fifth magnetic resistor element, 224: seventh magnetic resistor element, 250: first terminal, 260: third terminal, 310: second magnetosensitive unit, 312: second magnetic resistor element, 312a: magnetosensitive region, 312b: magnetosensitive region, 312c: magnetosensitive region, 312d: magnetosensitive region, 314: fourth magnetic resistor element, 322: sixth magnetic resistor element, 324: eighth magnetic resistor element, 350: second terminal, 360: fourth terminal, 512: first region, 514: second region, 516: third region, 518: fourth region, 522: location, 524: location, 526: location, 528: location, 530: amplifier circuit

What is claimed is:

1. A detector apparatus comprising a first magnetosensitive unit and a second magnetosensitive unit configured to detect a change in magnetic flux density in response to movement of a to-be-detected unit, the first magnetosensitive unit includes a first magnetic resistor element and a third magnetic resistor element that are aligned in a movement detection direction and that are electrically connected in series between a first potential and a second potential, the second magnetosensitive unit includes a second magnetic resistor element and a fourth magnetic resistor element that are aligned in the movement detection direction and that are electrically connected in series between the first potential and the second potential, the first magnetic resistor element, the second magnetic resistor element, the third magnetic resistor element, and the fourth magnetic resistor form a Wheatstone bridge circuit, the second magnetic resistor element is positioned between the first magnetic resistor element and the third magnetic resistor element in the movement detection direction, the third magnetic resistor element is positioned between the second magnetic resistor element and the fourth magnetic resistor element in the movement detection direction, and wherein the third magnetic resistor element has a lower resistance for a same magnetic field than the first magnetic resistor element, and the second magnetic resistor element has a lower resistance for a same magnetic field than the fourth magnetic resistor element.

2. The detector apparatus as set forth in claim 1, wherein the third magnetic resistor element has a different shape than the first magnetic resistor element, and the second magnetic resistor element has a different shape than the fourth magnetic resistor element.

3. The detector apparatus as set forth in claim 2, wherein the third magnetic resistor element is shaped in such a manner that the third magnetic resistor element is at least partially shorter than the first magnetic resistor element in a direction orthogonal to the movement detection direction, and the second magnetic resistor element is shaped in such a manner that the second magnetic resistor element is at least partially shorter than the fourth magnetic resistor element in the direction orthogonal to the movement detection direction.

4. The detector apparatus as set forth in claim 1, comprising a substrate, wherein the first magnetosensitive unit and the second magnetosensitive unit are formed on the substrate, and the first magnetic resistor element, the second magnetic resistor element, the third magnetic resistor element and the fourth magnetic resistor element are aligned on the substrate in the movement detection direction in such a manner that locations of centers of magnetosensitive surfaces are arranged at equal intervals.

5. The detector apparatus as set forth in claim 1, wherein the first magnetic resistor element and the fourth magnetic resistor element have equal resistances for a same magnetic field, and the second magnetic resistor element and the third magnetic resistor element have equal resistances for a same magnetic field.

6. The detector apparatus as set forth in claim 1, wherein in a zero-magnetic-field environment in which no magnetic field is applied to the detector apparatus, a potential between the first magnetic resistor element and the third magnetic resistor element is different by a first offset voltage than a midpoint potential between the first potential and the second potential, and a potential between the second magnetic resistor element and the fourth magnetic resistor element is different by a second offset voltage than the midpoint potential between the first potential and the second potential.

7. The detector apparatus as set forth in claim 1, wherein in a zero-magnetic-field environment in which no magnetic field is applied to the detector apparatus, a potential between the first magnetic resistor element and the third magnetic resistor element is different by a first offset voltage than a midpoint potential between the first potential and the second potential, a potential between the second magnetic resistor element and the fourth magnetic resistor element is different by a second offset voltage than the midpoint potential between the first potential and the second potential, the detector apparatus comprises a magnetic-field applying unit configured to apply, to the first magnetosensitive unit and the second magnetosensitive unit, magnetic field in which magnetic flux density gradually increases or decreases in the movement detection direction, the first offset voltage and the second offset voltage change toward 0 V when a ratio of magnetic flux density applied to the third magnetic resistor element to magnetic flux density applied to the first magnetic resistor element increases and a ratio of magnetic flux density applied to the second magnetic resistor element to magnetic flux density applied to the fourth magnetic resistor element increases.

8. The detector apparatus as set forth in claim 7, wherein when the detector apparatus is placed in a vicinity of the to-be-detected unit and detects magnetic field generated between the magnetic-field applying unit and the to-be-detected unit, the first offset voltage and the second offset voltage change toward 0 V when compared with an offset voltage generated in the zero-magnetic-field environment.

9. The detector apparatus as set forth in claim 1, wherein at least one magnetic resistor element of the first magnetic resistor element, the second magnetic resistor element, the third magnetic resistor element and the fourth magnetic resistor element has a variable magnetic resistance.

10. The detector apparatus as set forth in claim 1, wherein the first magnetic resistor element, the second magnetic resistor element, the third magnetic resistor element and the fourth magnetic resistor element each include a semiconductor magnetic resistor element in a magnetosensitive region thereof.

11. A detector system comprising:

the to-be-detected unit; and the detector apparatus as set forth in claim 1, the detector apparatus oriented such that the movement detection direction of the detector apparatus is parallel to a moving direction of the to-be-detected unit.

12. The detector system as set forth in claim 11, wherein the to-be-detected unit includes a depression and a protrusion that are alternately arranged along the moving direction to face the detector apparatus.

13. The detector system as set forth in claim 12, wherein the to-be-detected unit is a gear.

14. The detector system as set forth in claim 13, wherein a distance between the gear and the third magnetic resistor element is smaller than a distance between the gear and the first magnetic resistor element, and a distance between the gear and the second magnetic resistor element is smaller than a distance between the gear and the fourth magnetic resistor element.

15. The detector system as set forth in claim 11, wherein the to-be-detected unit includes a plate member having a plurality of through holes that are arranged along the moving direction to face the detector apparatus.

16. The detector system as set forth in claim 11, further comprising a magnetic-field generating unit opposing the to-be-detected unit with the detector apparatus being sandwiched therebetween.

17. A detector apparatus comprising a first magnetosensitive unit and a second magnetosensitive unit configured to detect a change in magnetic flux density in response to movement of a to-be-detected unit, the first magnetosensitive unit includes a first magnetic resistor element and a third magnetic resistor element that are aligned in a movement detection direction and that are electrically connected in series between a first potential and a second potential, the second magnetosensitive unit includes a second magnetic resistor element and a fourth magnetic resistor element that are aligned in the movement detection direction and that are electrically connected in series between the first potential and the second potential, the first magnetic resistor element, the second magnetic resistor element, the third magnetic resistor element, and the fourth magnetic resistor form a Wheatstone bridge circuit, the second magnetic resistor element is positioned between the first magnetic resistor element and the third magnetic resistor element in the movement detection direction, the third magnetic resistor element is positioned between the second magnetic resistor element and the fourth magnetic resistor element in the movement detection direction, wherein the third magnetic resistor element has a higher resistance for a same magnetic field than the first magnetic resistor element, and the second magnetic resistor element has a higher resistance for a same magnetic field than the fourth magnetic resistor element.

18. The detector apparatus as set forth in claim 17, wherein the first magnetic resistor element is shaped in such a manner that the first magnetic resistor element is at least partially shorter than the third magnetic resistor element in a direction orthogonal to the movement detection direction, and the fourth magnetic resistor element is shaped in such a manner that the fourth magnetic resistor element is at least partially shorter than the second magnetic resistor element in the direction orthogonal to the movement detection direction.

19. The detector apparatus as set forth in claim 17, wherein in a zero-magnetic-field environment in which no magnetic field is applied to the detector apparatus, a potential between the first magnetic resistor element and the third magnetic resistor element is different by a first offset voltage than a midpoint potential between the first potential and the second potential, a potential between the second magnetic resistor element and the fourth magnetic resistor element is different by a second offset voltage than the midpoint potential between the first potential and the second potential, the detector apparatus comprises a magnetic-field applying unit configured to apply, to the first magnetosensitive unit and the second magnetosensitive unit, magnetic field in which magnetic flux density gradually increases or decreases in the movement detection direction, the first offset voltage and the second offset voltage change toward 0 V when a ratio of magnetic flux density applied to the third magnetic resistor element to magnetic flux density applied to the first magnetic resistor element decreases and a ratio of magnetic flux density applied to the second magnetic resistor element to magnetic flux density applied to the fourth magnetic resistor element decreases.

20. A detector apparatus comprising a first magnetosensitive unit and a second magnetosensitive unit configured to detect a change in magnetic flux density in response to movement of a to-be-detected unit, wherein the first magnetosensitive unit includes (i) a first magnetic resistor element and a third magnetic resistor element that are aligned in a movement detection direction and (ii) a first resistor that is electrically connected to the first magnetic resistor element, the second magnetosensitive unit includes (I) a second magnetic resistor element and a fourth magnetic resistor element that are aligned in the movement detection direction and (II) a second resistor that is electrically connected to the fourth magnetic resistor element, the first magnetic resistor element, the second magnetic resistor element, the third magnetic resistor element, the fourth magnetic resistor, the first resistor, and the second resistor form a Wheatstone bridge circuit, the second magnetic resistor element is positioned between the first magnetic resistor element and the third magnetic resistor element in the movement detection direction, the third magnetic resistor element is positioned between the second magnetic resistor element and the fourth magnetic resistor element in the movement detection direction, the first resistor, the first magnetic resistor element and the third magnetic resistor element are electrically connected in series between a first potential and a second potential, the second magnetic resistor element, the fourth magnetic resistor element and the second resistor are electrically connected in series between the first potential and the second potential, and wherein a compound resistor of the first resistor and the first magnetic resistor element has a higher resistance for a same magnetic field than the third magnetic resistor element, and a compound resistor of the second resistor and the fourth magnetic resistor element has a higher resistance for a same magnetic field than the second magnetic resistor element.

21. The detector apparatus as set forth in claim 20, wherein the first magnetic resistor element, the second magnetic resistor element, the third magnetic resistor element and the fourth magnetic resistor element have equal resistances for a same magnetic field.

22. A detector apparatus, comprising a first magnetosensitive unit and a second magnetosensitive unit configured to detect a change in magnetic flux density in response to movement of a to-be-detected unit, wherein the first magnetosensitive unit includes (i) a first magnetic resistor element and a third magnetic resistor element that are aligned in a movement detection direction and (ii) a first resistor that is electrically connected to the first magnetic resistor element, the second magnetosensitive unit includes (I) a second magnetic resistor element and a fourth magnetic resistor element that are aligned in the movement detection direction and (II) a second resistor that is electrically connected to the fourth magnetic resistor element, the first magnetic resistor element, the second magnetic resistor element, the third magnetic resistor element, the fourth magnetic resistor, the first resistor, and the second resistor form a Wheatstone bridge circuit, the second magnetic resistor element is positioned between the first magnetic resistor element and the third magnetic resistor element in the movement detection direction, the third magnetic resistor element is positioned between the second magnetic resistor element and the fourth magnetic resistor element in the movement detection direction, the first resistor, the first magnetic resistor element and the third magnetic resistor element are electrically connected in series between a first potential and a second potential, the second magnetic resistor element, the fourth magnetic resistor element and the second resistor are electrically connected in series between the first potential and the second potential, wherein a compound resistor of the first resistor and the first magnetic resistor element has a lower resistance for a same magnetic field than the third magnetic resistor element, and a compound resistor of the second resistor and the fourth magnetic resistor element has a lower resistance for a same magnetic field than the second magnetic resistor element.

* * * * *